United States Patent
Kim et al.

(10) Patent No.: US 11,881,496 B2
(45) Date of Patent: Jan. 23, 2024

(54) IMAGE SENSOR

(71) Applicant: SAMSUNG ELECTRONICS CO., LTD., Suwon-si (KR)

(72) Inventors: Jameyung Kim, Seoul (KR); Tae-Hun Lee, Suwon-si (KR); Dongmo Im, Seoul (KR); Kwansik Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 358 days.

(21) Appl. No.: 17/246,064

(22) Filed: Apr. 30, 2021

(65) Prior Publication Data

US 2022/0102398 A1    Mar. 31, 2022

(30) Foreign Application Priority Data

Sep. 28, 2020   (KR) ........................ 10-2020-0125668

(51) Int. Cl.
*H01L 31/112*    (2006.01)
*H01L 27/146*    (2006.01)

(52) U.S. Cl.
CPC ...... *H01L 27/1463* (2013.01); *H01L 27/1462* (2013.01); *H01L 27/1464* (2013.01); *H01L 27/14621* (2013.01); *H01L 27/14623* (2013.01); *H01L 27/14627* (2013.01); *H01L 27/14636* (2013.01); *H01L 27/14645* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 6,476,445 B1* | 11/2002 | Brown | H01L 21/76264 257/E21.549 |
| 8,242,547 B2 | 8/2012 | Kudoh | |
| 8,723,999 B2 | 5/2014 | Kido et al. | |
| 10,074,678 B2 | 9/2018 | Kato et al. | |
| 2009/0046186 A1 | 2/2009 | Nagai | |
| 2009/0212337 A1* | 8/2009 | Murakoshi | H01L 27/14689 257/E21.546 |
| 2010/0270636 A1* | 10/2010 | Huang | H01L 27/14687 257/E31.113 |
| 2011/0227185 A1* | 9/2011 | Yamaguchi | H01L 27/1463 257/443 |

(Continued)

FOREIGN PATENT DOCUMENTS

KR    10-2087233 B1    3/2020

*Primary Examiner* — Ali Naraghi
(74) *Attorney, Agent, or Firm* — Sughrue Mion, PLLC

(57) ABSTRACT

An image sensor includes a substrate, and a pixel separation pattern disposed in the substrate and interposed between a plurality of unit pixels. The plurality of unit pixels include a first unit pixel region and a second unit pixel region adjacent to the first unit pixel region in a first direction. The first unit pixel region and the second unit pixel region respectively include a first transfer gate and a second transfer gate. The pixel separation pattern includes a first pixel separation part interposed between the first unit pixel region and the second unit pixel region, and a second pixel separation part spaced apart from the first pixel separation part in the first direction. A top surface of the first pixel separation part is lower than a top surface of the second pixel separation part.

10 Claims, 24 Drawing Sheets

(56) References Cited

U.S. PATENT DOCUMENTS

| | | |
|---|---|---|
| 2014/0197464 A1 | 7/2014 | Ihara |
| 2019/0067357 A1* | 2/2019 | Cheng ............... H01L 27/14621 |
| 2019/0109171 A1 | 4/2019 | Ito |
| 2019/0371838 A1 | 12/2019 | Takahashi et al. |

* cited by examiner

IMAGE SENSOR

CROSS-REFERENCE TO RELATED APPLICATION

This application is based on and claims priority under 35 U.S.C § 119 to Korean Patent Application No. 10-2020-0125668 filed on Sep. 28, 2020, in the Korean Intellectual Property Office, the disclosure of which is incorporated by reference herein in its entirety.

BACKGROUND

The disclosure relates to an image sensor, and more particularly, to a conductive structure of an image sensor.

An image sensor is a device that converts optical images into electrical signals. An image sensor can be classified into a charge coupled device (CCD) type and a complementary metal oxide semiconductor (CMOS) type. A CMOS type image sensor is abbreviated as CIS (CMOS image sensor). The CIS includes a plurality of unit pixel regions that are arranged two-dimensionally. Each of the unit pixel regions includes a photodiode. The photodiode serves to convert incident light into electrical signals.

SUMMARY

Provided is an image sensor capable of reducing an electric field concentration.

Provided is an image sensor capable of obtaining pattern margins for forming transfer gates.

Additional aspects will be set forth in part in the description which follows and, in part, will be apparent from the description, or may be learned by practice of presented embodiments.

According to embodiments, an image sensor includes a substrate, and a pixel separation pattern disposed in the substrate and interposed between a plurality of unit pixels. The plurality of unit pixels includes a first unit pixel region and a second unit pixel region adjacent to the first unit pixel region in a first direction. The first unit pixel region and the second unit pixel region respectively include a first transfer gate and a second transfer gate. The pixel separation pattern includes a first pixel separation part interposed between the first unit pixel region and the second unit pixel region, and a second pixel separation part spaced apart from the first pixel separation part in the first direction. The second transfer gate is interposed between the first pixel separation part and the second pixel separation part. A top surface of the first pixel separation part is lower than a top surface of the second pixel separation part.

According to embodiments, an image sensor includes a substrate including a plurality of active regions, a device separation layer disposed in the substrate and interposed between the plurality of active regions, and a pixel separation pattern disposed in the substrate and interposed between a plurality of unit pixels. The plurality of unit pixels includes a first unit pixel region and a second unit pixel region spaced apart from the first unit pixel region in a first direction. The first unit pixel region includes a first floating diffusion region and a first transfer gate. The second unit pixel region includes a second floating diffusion region and a second transfer gate. A top surface of the device separation layer interposed between the first transfer gate and the second transfer gate is lower than a top surface of the device separation layer interposed between the first floating diffusion region and the second floating diffusion region.

According to embodiments, an image sensor includes a substrate including a first surface and a second surface, a pixel separation pattern disposed in the substrate and interposed between a plurality of unit pixels, an antireflective layer disposed on the second surface of the substrate, a plurality of color filters and a plurality of micro-lenses disposed on the antireflective layer, and a wiring layer disposed on the first surface of the substrate. The plurality of unit pixels includes a first unit pixel region and a second unit pixel region adjacent to the first unit pixel region in a first direction. The first unit pixel region and the second unit pixel region respectively include a first transfer gate and a second transfer gate. The pixel separation pattern includes a first pixel separation part interposed between the first unit pixel region and the second unit pixel region, and a second pixel separation part spaced apart from the first pixel separation part in the first direction. The second transfer gate is interposed between the first pixel separation part and the second pixel separation part, and a top surface of the first pixel separation part is lower than a top surface of the second pixel separation part.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
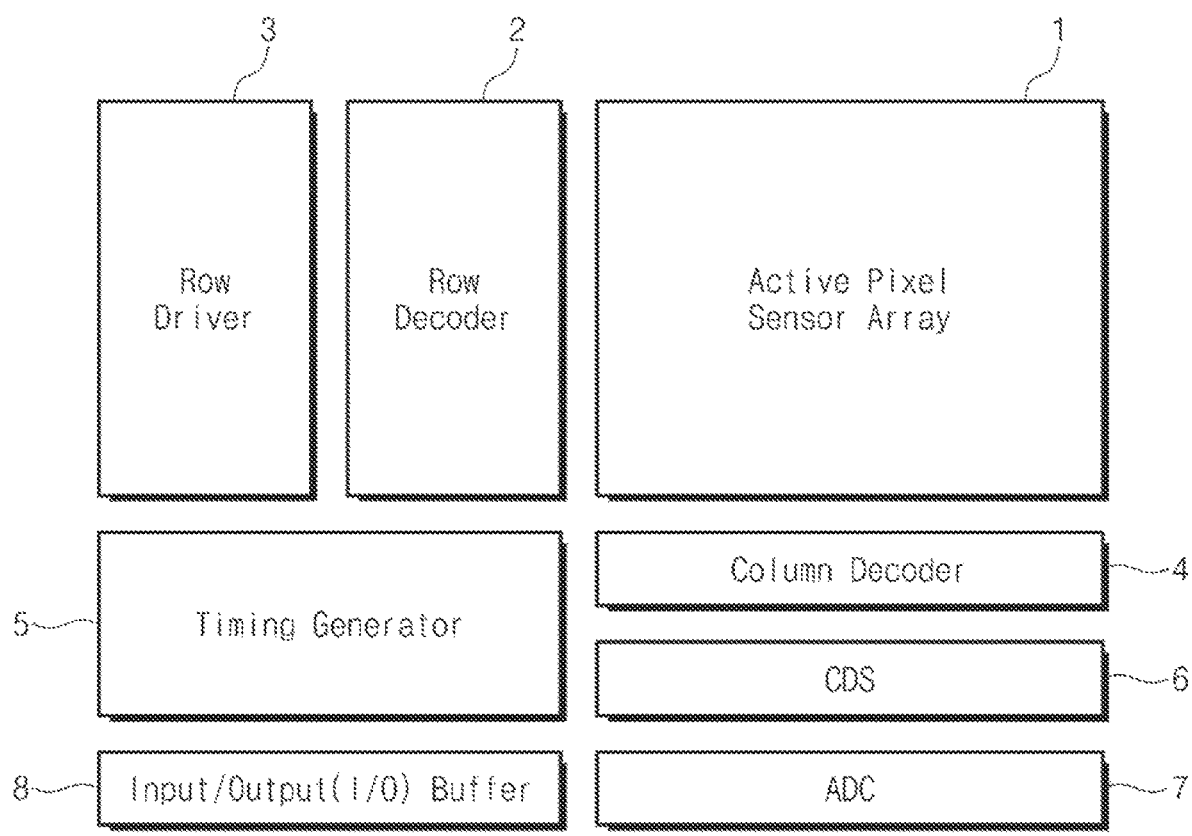
FIG. 1 illustrates a simplified block diagram showing an image sensor according to embodiments.

FIG. 1 illustrates a simplified block diagram showing an image sensor according to embodiments.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of two-dimensionally arranged pixels, each of which is configured to convert optical signals into electrical signals. The active pixel sensor array 1 may be driven by a plurality of driving signals, such as a pixel selection signal, a reset signal, and a charge transfer signal, which are provided from the row driver 3. In addition, the correlated double sampler 6 may be provided with the electrical signals which are converted by the active pixel sensor array 1.

The row driver 3 may provide the active pixel sensor array 1 with several driving signals for driving the plurality of pixels in accordance with a decoded result obtained from the row decoder 2. When the plurality of pixels are arranged in a matrix shape, the driving signals may be provided for each row. The timing generator 5 may provide timing and control signals to the row decoder 2 and the column decoder 4. The correlated double sampler 6 may receive the electrical signals generated from the active pixel sensor array 1, and may hold and sample the received electrical signals. The correlated double sampler 6 may perform a double sampling operation to sample a noise level and a signal level of the electrical signal, and then may output a difference level corresponding to a difference between the noise and signal levels.

The analog-to-digital converter 7 may convert analog signals, which correspond to the difference level received from the correlated double sampler 6, into digital signals and then output the converted digital signals. The input/output buffer 8 may latch the digital signals and then may sequentially output the latched digital signals to an image signal processing unit in response to the decoded result obtained from the column decoder 4.

Figure 2:
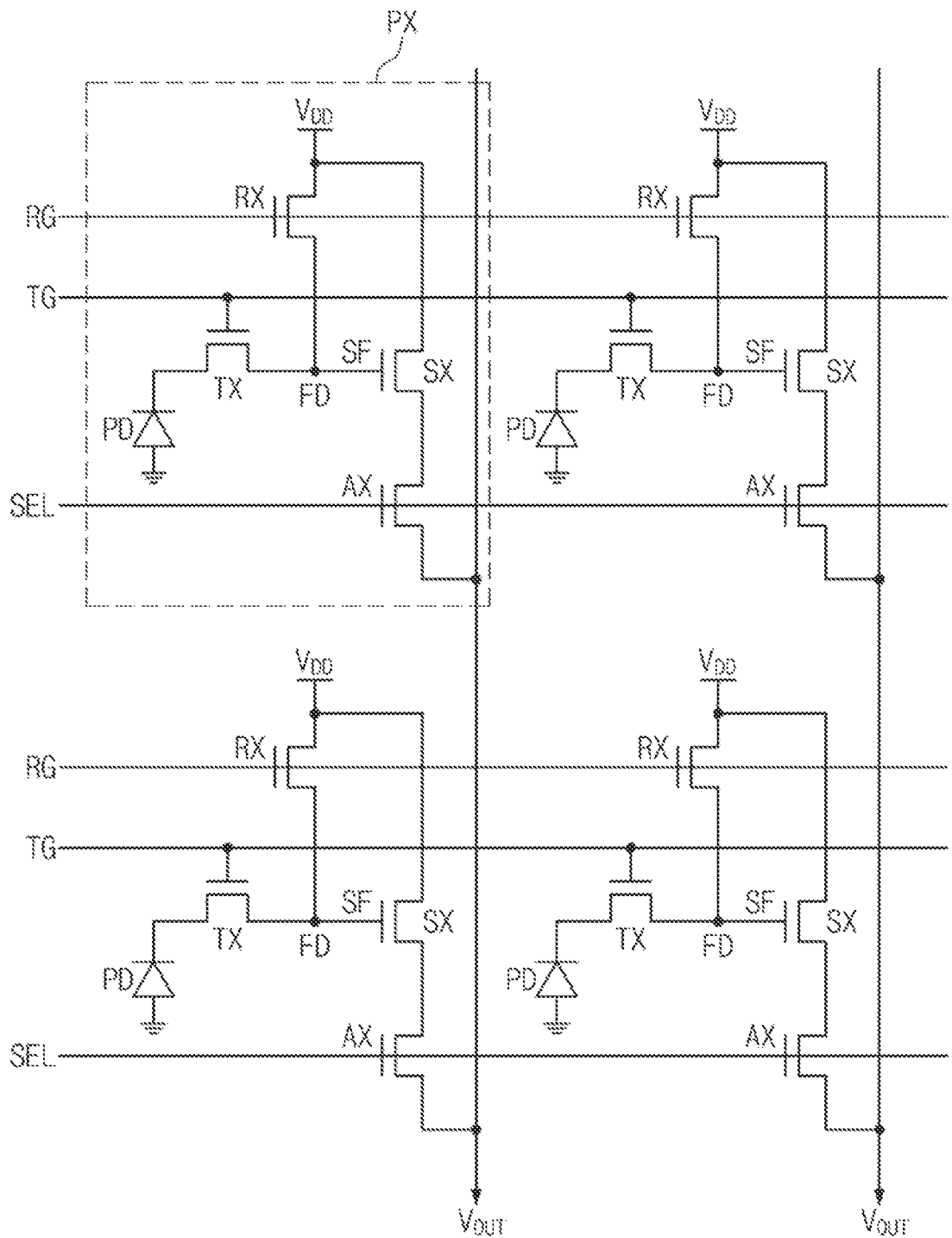
FIG. 2 illustrates a circuit diagram showing an active pixel sensor array of an image sensor according to embodiments.

FIG. 2 illustrates a circuit diagram showing an active pixel sensor array of an image sensor according to embodiments.

Referring to FIGS. 1 and 2, the active pixel sensor array 1 may include a plurality of pixels PX, and the pixels PX may be arranged in a matrix shape. Each of the pixels PX may include a transfer transistor TX and logic transistors RX, SX, and AX. The logic transistors may include a reset transistor RX, a selection transistor AX, and a source follower transistor SX. The transfer transistor TX, the reset transistor RX, and the selection transistor AX may respectively include a transfer gate TG, a reset gate RG, and a selection gate SEL. Each of the pixels PX may further include a photoelectric conversion element PD and a floating diffusion region FD.

The photoelectric conversion element PD may create and accumulate photo-charges in proportion to an amount of externally incident light. The photoelectric conversion element PD may be a photodiode which includes a P-type impurity region and an N-type impurity region. The transfer transistor TX may transfer charges generated in the photoelectric conversion element PD into the floating diffusion region FD. The floating diffusion region FD may accumulate and store the charges generated and transferred from the photoelectric conversion element PD. The source follower transistor SX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage VDD. When the reset transistor RX is turned on, the floating diffusion region FD may be supplied with the power voltage VDD connected to the source electrode of the reset transistor RX. Accordingly, when the reset transistor RX is turned on, the charges accumulated in the floating diffusion region FD may be exhausted and thus the floating diffusion region FD may be reset.

The source follower transistor SX may serve as a source follower buffer amplifier. The source follower transistor SX may amplify a variation in electrical potential of the floating diffusion region FD and may output the amplified electrical potential to an output line VOUT. The selection transistor AX may select each row of the pixels PX to be readout. When the selection transistor AX is turned on, the power voltage VDD may be applied to a drain electrode of the source follower transistor SX.

FIG. 2 depicts by way of example a unit pixel PX which includes one photoelectric conversion element PD and four transistors TX, RX, AX, and SX, but the image senor is not limited thereto. For example, neighboring pixels PX may share one of the reset transistor RX, the source follower transistor SX, and the selection transistor AX. In addition, the unit pixel PX may include a plurality of photoelectric conversion elements PD. A plurality of neighboring pixels PX may share a single floating diffusion region FD.

Figure 3:
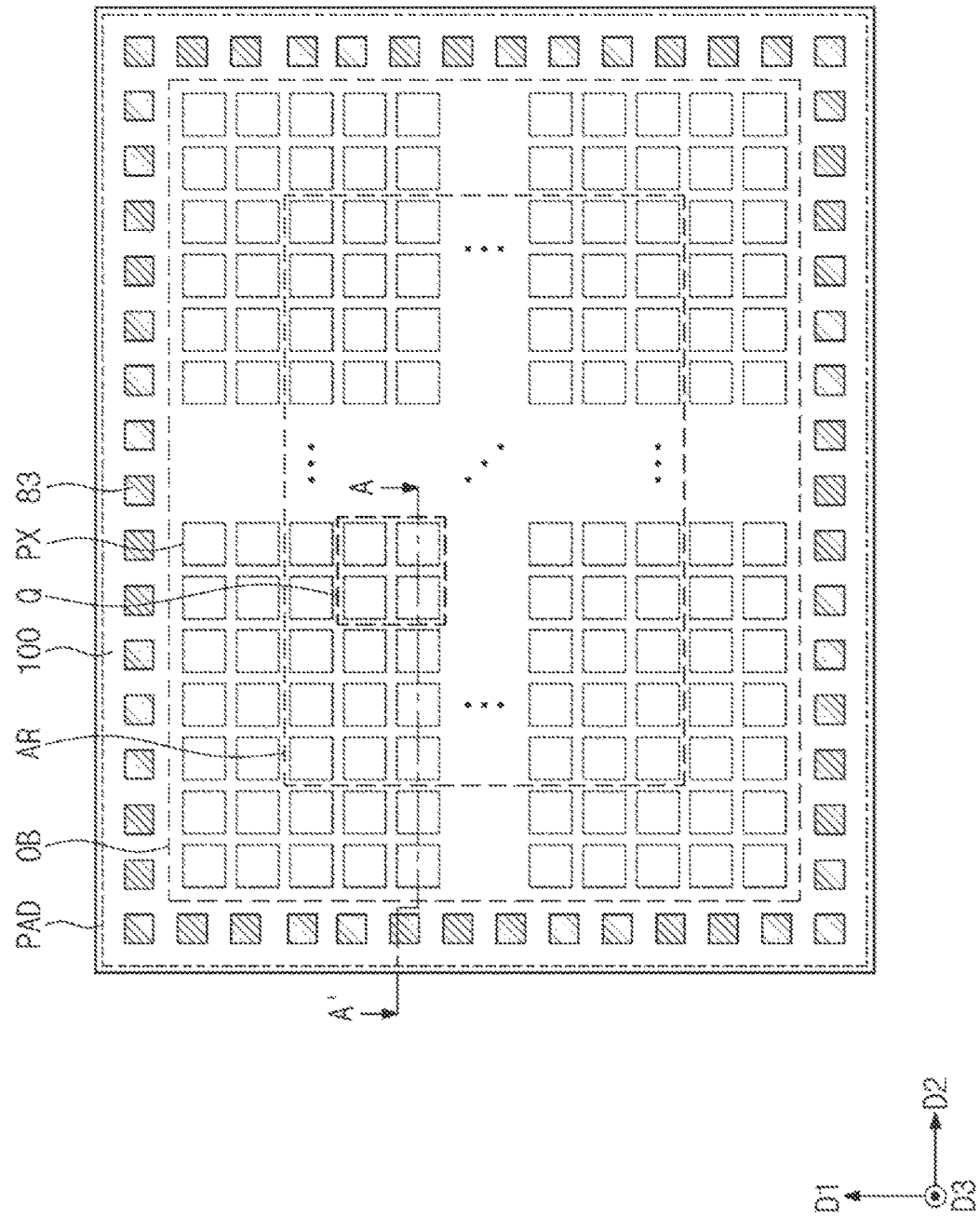
FIG. 3 illustrates a plan view showing an image sensor according to embodiments.
Figure 4:
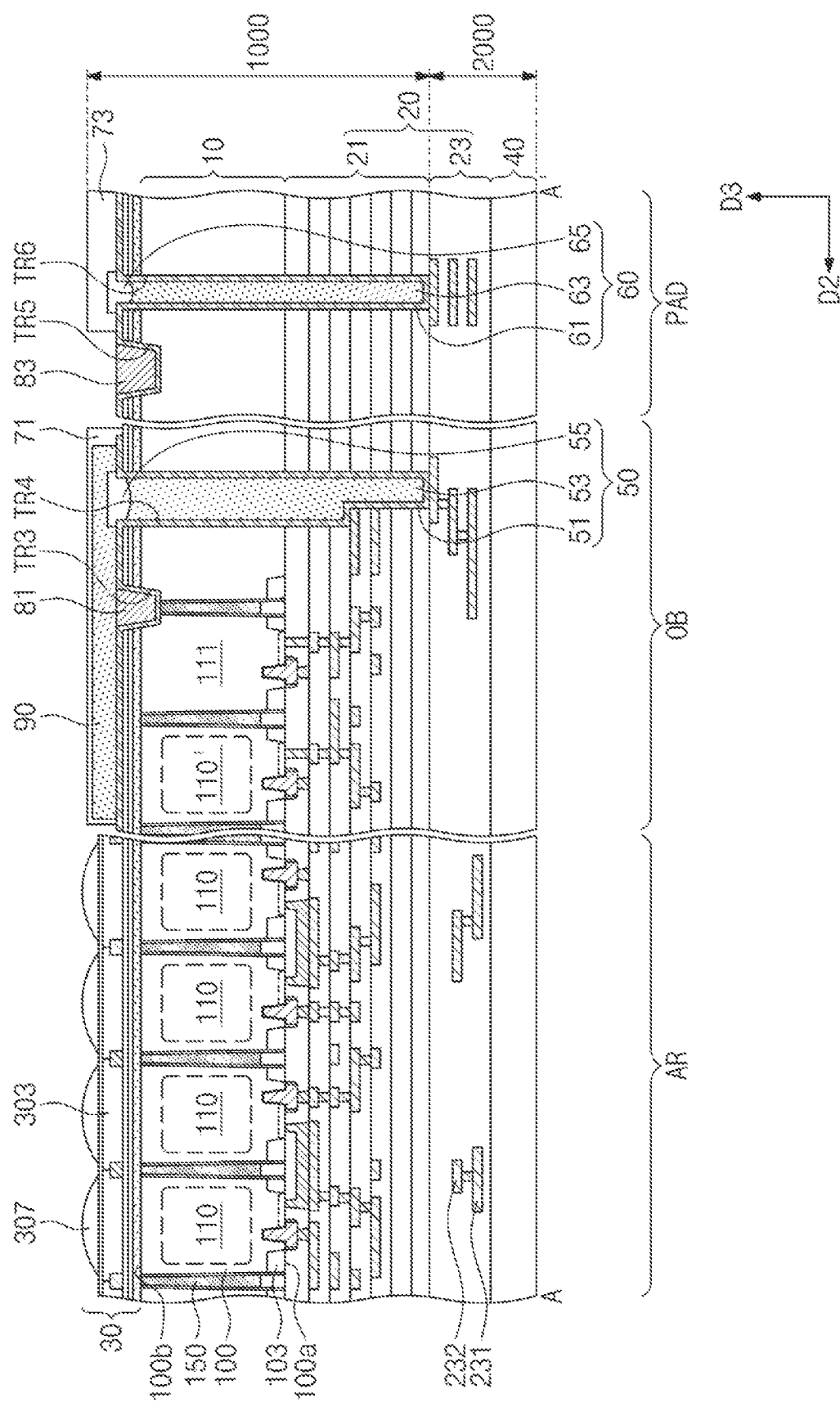
FIG. 4 illustrates a cross-sectional view taken along line A-A' of FIG. 3.

FIG. 3 illustrates a plan view showing an image sensor according to embodiments. FIG. 4 illustrates a cross-sectional view taken along line A-A' of FIG. 3.

Referring to FIGS. 3 and 4, an image sensor may include a sensor chip 1000 and a circuit chip 2000. The sensor chip 1000 may include a photoelectric conversion layer 10, a first wiring layer 21, and an optical transmittance layer 30. The photoelectric conversion layer 10 may include a first substrate 100, a pixel separation pattern 150, a device separation pattern 103, and photoelectric conversion regions 110 provided in the first substrate 100. The photoelectric conversion regions 110 may convert externally incident light into electrical signals.

When viewed in plan, the first substrate 100 may include a pixel array region AR, an optical black region OB, and a pad region PAD. When viewed in plan, the pixel array region AR may be disposed on a central portion of the first substrate 100. The pixel array region AR may include a plurality of unit pixels PX. The unit pixels PX may output photoelectric signals from incident light. The unit pixels PX may be two-dimensionally arranged in columns and rows. The columns may be parallel to a first direction D1. The rows may be parallel to a second direction D2. In this description, the first direction D1 may be parallel to a first surface 100a of the first substrate 100. The second direction D2 may be parallel to the first surface 100a of the first substrate 100 and may be different from the first direction D1. For example, the second direction D2 may be substantially orthogonal to the first direction D1. A third direction D3 may be substantially perpendicular to the first surface 100a of the first substrate 100.

The pad region PAD may be provided on an edge portion of the first substrate 100, and when viewed in plan, may surround the pixel array region AR. Second pad terminals 83 may be provided on the pad region PAD. The second pad terminals 83 may externally output electrical signals generated from the unit pixels PX. Alternatively, external electrical signals or voltages may be transferred through the second pad terminals 83 to the unit pixels PX.

The optical black region OB may be disposed between the pixel array region AR and the pad region PAD of the first substrate 100. When viewed in plan, the optical black region OB may surround the pixel array region AR. The optical black region OB may include a plurality of dummy regions 111 each of which does not include the photoelectric conversion region 110. The optical black region OB may include a photoelectric conversion region 110' which has a similar structure to that of the photoelectric conversion region 110 of the pixel array region AR and which does not perform an operation by which electrical signals are produced from received light. The photoelectric conversion region 110' and the dummy region 111 of the optical black region OB may generate signals which are used as information to remove process noise.

The circuit chip 2000 may be stacked on the sensor chip 1000. The circuit chip 2000 may include a second substrate 40 and a second wiring layer 23. The second wiring layer 23 may be interposed between the first wiring layer 21 and the second substrate 40. The second wiring layer 23 and the first wiring layer 21 may constitute a wiring structure 20. The second substrate 40 may include a plurality of transistors that constitute components other than the active pixel sensor array 1 of FIG. 1.

On the optical black region OB, the first substrate 100 may be provided thereon with a first connection structure 50, a first pad terminal 81, and a bulk color filter 90. The first connection structure 50 may include a first light-shield pattern 51, a first dielectric pattern 53, and a first capping pattern 55. The first light-shield pattern 51 may be provided on a second surface 100b of the first substrate 100. The first light-shield pattern 51 may cover the second surface 100b, and may conformally cover an inner wall of a third trench TR3 and an inner wall of a fourth trench TR4. The first light-shield pattern 51 may penetrate and electrically connect the photoelectric conversion layer 10 and the first wiring layer 21. For example, the first light-shield pattern 51 may be in contact with wiring lines in the first wiring layer 21 and with the pixel separation pattern 150 in the photoelectric conversion layer 10. Therefore, the first connection structure 50 may be electrically connected to the wiring lines in the first wiring layer 21. The first light-shield pattern 51 may block light incident onto the optical black region OB.

The third trench TR3 may be provided therein with the first pad terminal 81 which fills an unoccupied portion of the third trench TR3. The first pad terminal 81 may include a metallic material, such as aluminum. The first pad terminal 81 may be connected to the pixel separation pattern 150. Therefore, a negative voltage may be applied through the first pad terminal 81 to the pixel separation pattern 150.

The first light-shield pattern 51 may be provided thereon with the first dielectric pattern 53 which fills an unoccupied portion of the fourth trench TR4. The first dielectric pattern 53 may penetrate the photoelectric conversion layer 10 and the first wiring layer 21. The first capping pattern 55 may be provided on the first dielectric pattern 53.

The bulk color filter 90 may be provided on the first pad terminal 81, the first light-shield pattern 51, and the first capping pattern 55. The bulk color filter 90 may cover the first pad terminal 81, the first light-shield pattern 51, and the first capping pattern 55. A first protective layer 71 may be provided on and cover the bulk color filter 90.

On the pad region PAD, the first substrate 100 may be provided thereon with a second connection structure 60, a second pad terminal 83, and a second protective layer 73.

The second connection structure 60 may include a second light-shield pattern 61, a second dielectric pattern 63, and a second capping pattern 65.

The second light-shield pattern 61 may be provided on the second surface 100b of the first substrate 100. For example, the second light-shield pattern 61 may cover the second surface 100b, and may conformally cover an inner wall of a fifth trench TR5 and an inner wall of a sixth trench TR6. The second light-shield pattern 61 may penetrate the photoelectric conversion layer 10 and a portion of the first wiring layer 21. For example, the second light-shield pattern 61 may be in contact with wiring lines 231 and 232 in the second wiring layer 23. The second light-shield pattern 61 may include a metallic material, such as tungsten (W).

The second pad terminal 83 may be provided in the fifth trench TR5. The second light-shield pattern 61 may be provided thereon with the second pad terminal 83 which fills an unoccupied portion of the fifth trench TR5. The second pad terminal 83 may include a metallic material, such as aluminum. The second pad terminal 83 may serve as an electrical connection path between the image sensor and the outside. The second dielectric pattern 63 may fill an unoccupied portion of the sixth trench TR6. The second dielectric pattern 63 may penetrate the photoelectric conversion layer 10 and an entirety or a portion of the first wiring layer 21. The second capping pattern 65 may be provided on the second dielectric pattern 63. The second protective layer 73 may cover the second capping pattern 65 and a portion of the second light-shield pattern 61.

A current applied through the second pad terminal 83 may flow toward the pixel separation pattern 150 by way of the second light-shield pattern 61, the wiring lines 231 and 232 in the second wiring layer 23, and the first light-shield pattern 51. Electrical signals generated from the photoelectric conversion regions 110 and 110' and the dummy region 111 may be transferred to logic transistors in the second substrate 40 of the circuit chip 2000 by way of the wiring lines in the first wiring layer 21, the wiring lines 231 and 232 in the second wiring layer 23, the second light-shield pattern 61, and the second pad terminal 83.

The pixel array region AR of the image sensor will be further discussed in detail below with reference to FIGS. 5 to 11.

Figure 5:
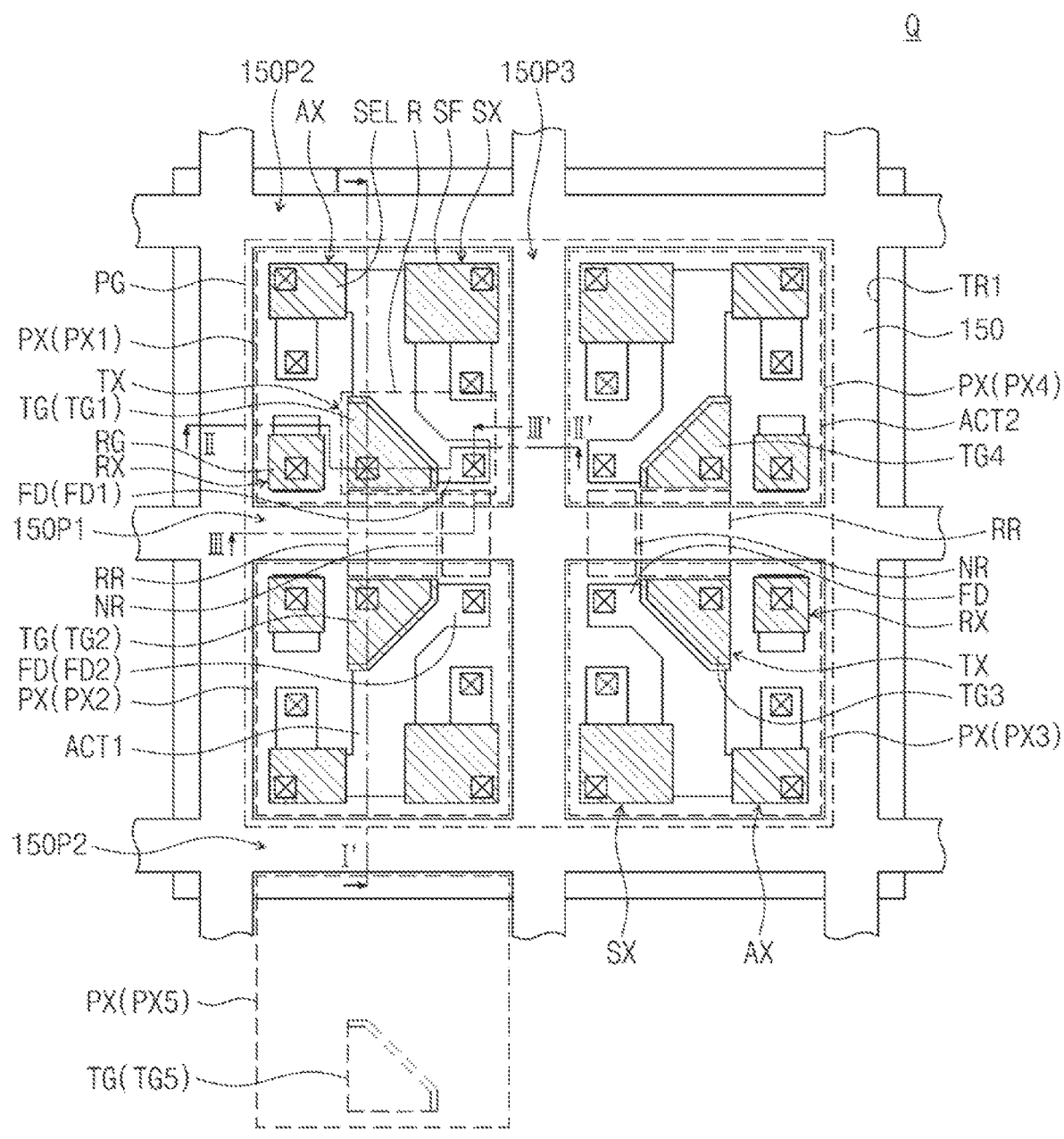
FIG. 5 illustrates an enlarged plan view showing section Q of FIG. 3.
Figure 5:
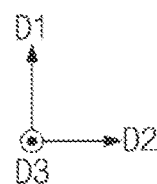
Figure 6:
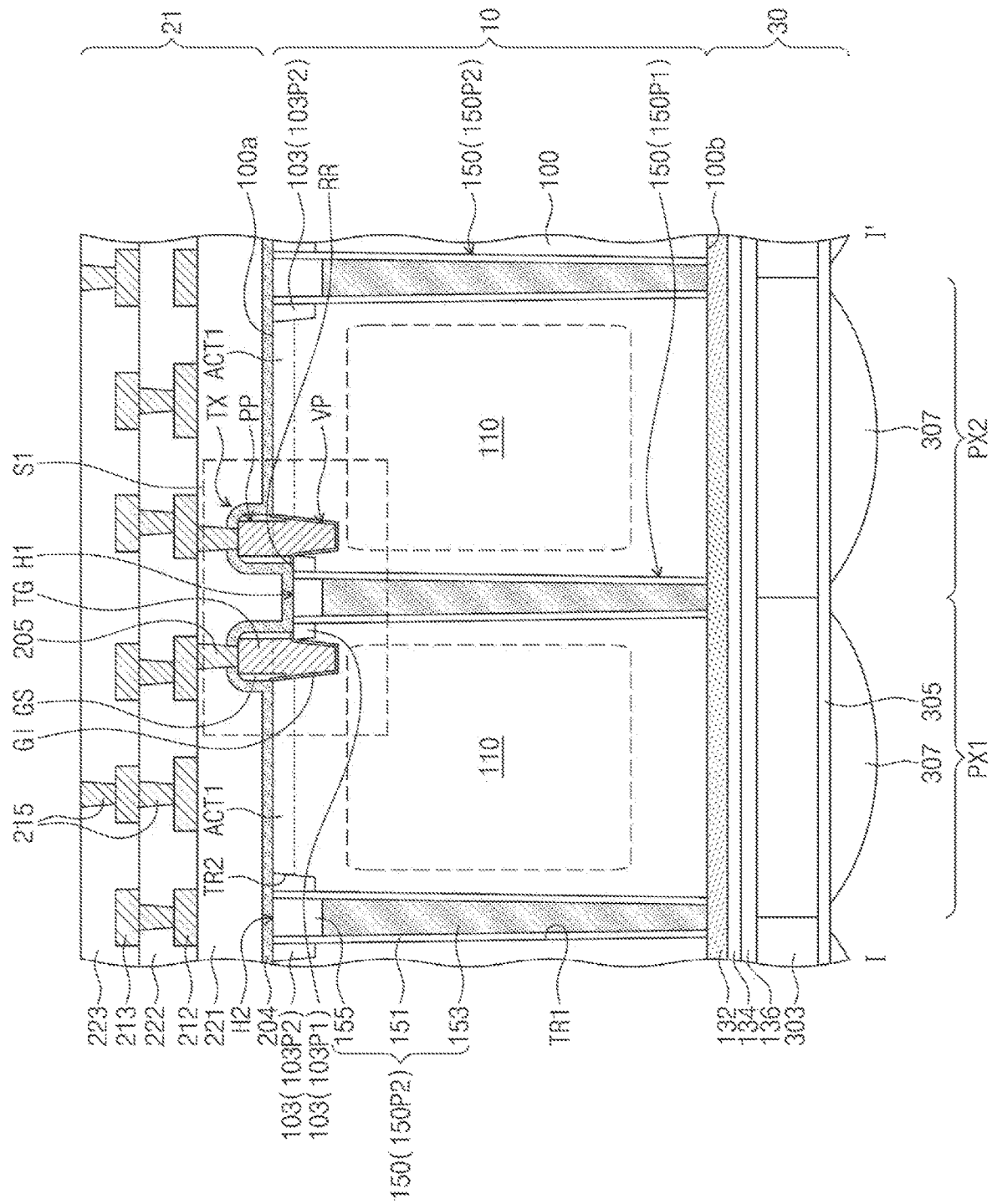
FIG. 6 illustrates a cross-sectional view taken along line I-I' of FIG. 5.
Figure 7:
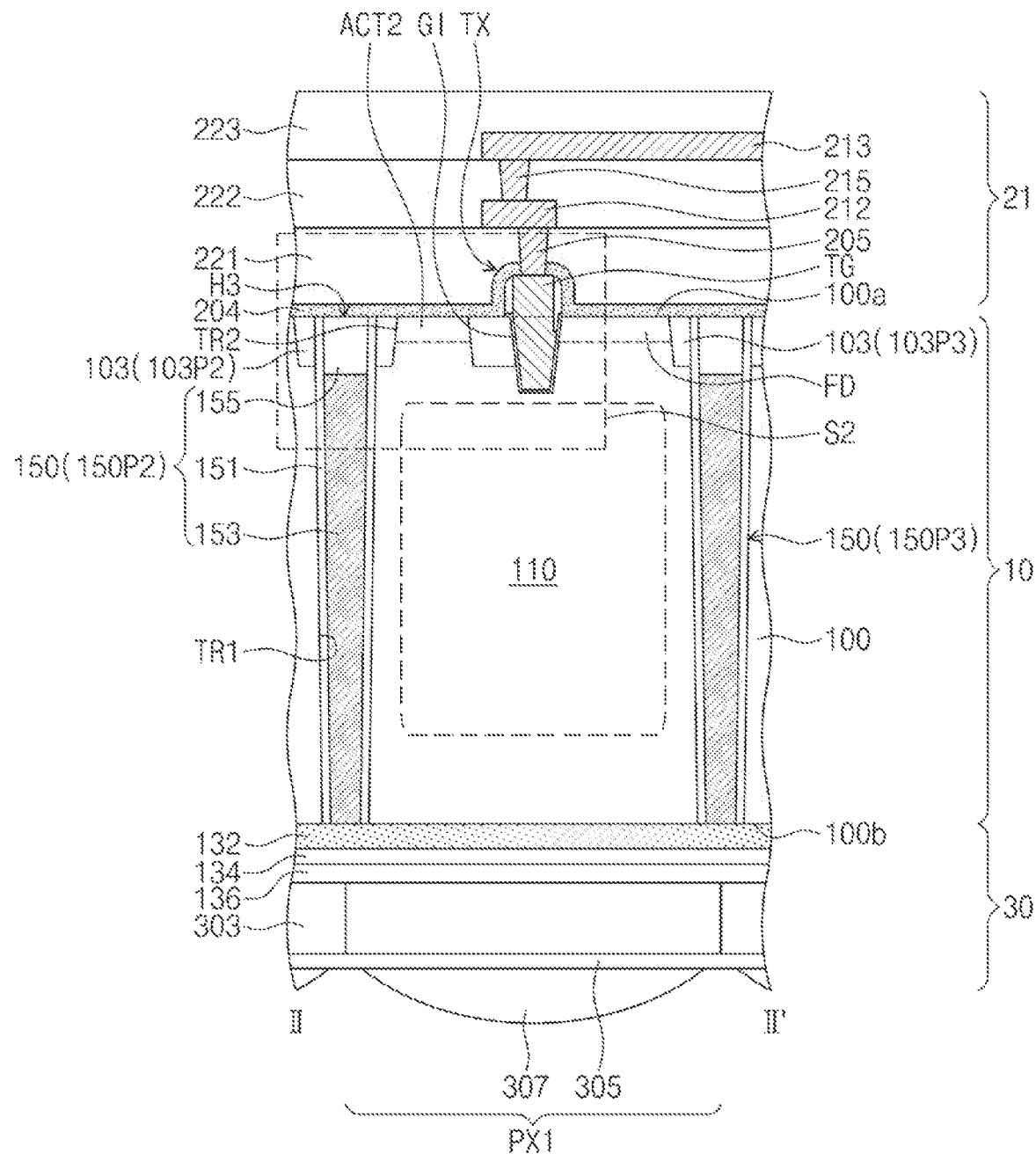
FIG. 7 illustrates a cross-sectional view taken along line II-II' of FIG. 5.
Figure 8:
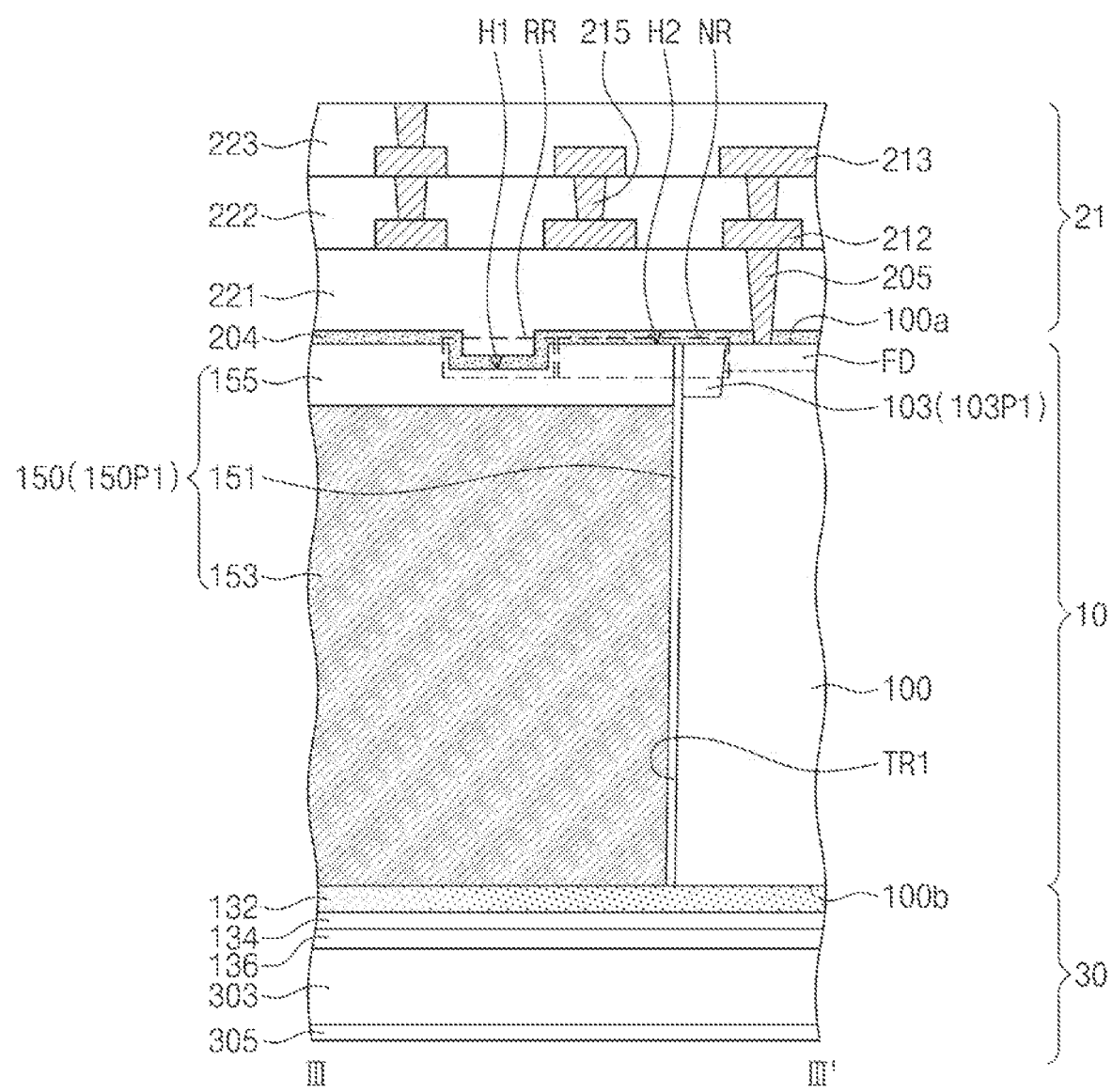
FIG. 8 illustrates a cross-sectional view taken along line III-III' of FIG. 5.
Figure 9:
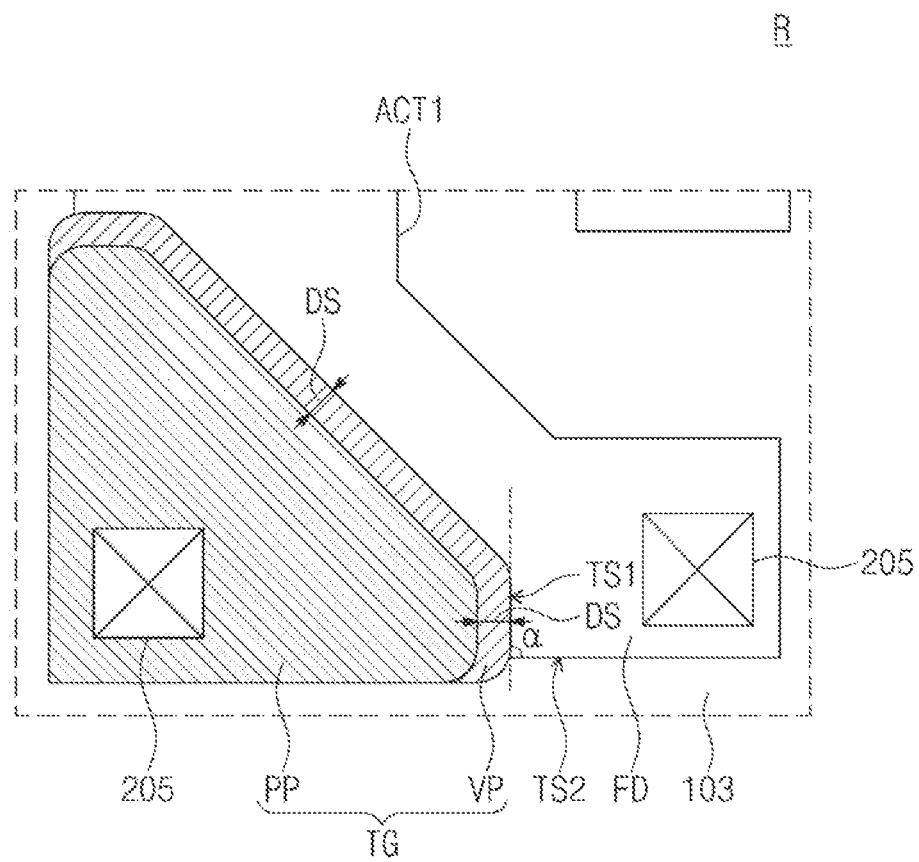
FIG. 9 illustrates an enlarged plan view showing section R of FIG. 5.
Figure 10:
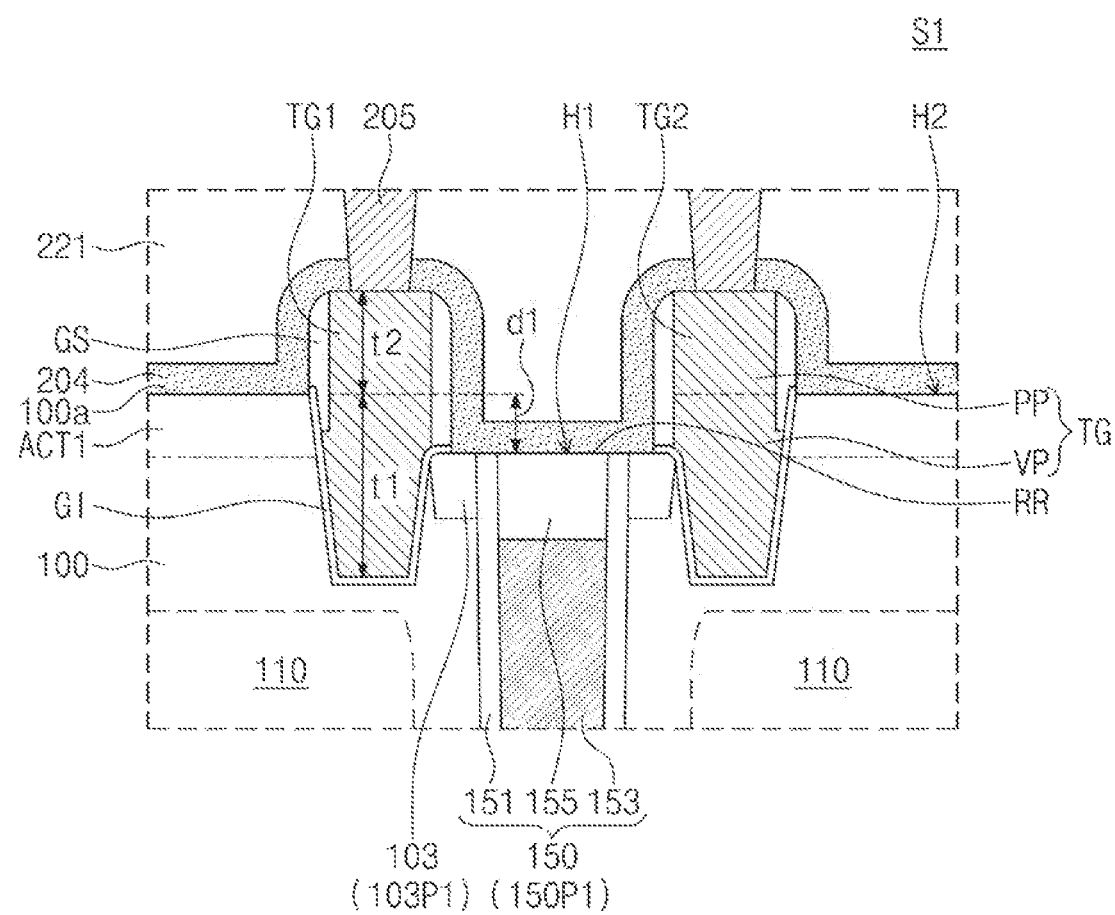
FIG. 10 illustrates an enlarged cross-sectional view showing section S1 of FIG. 6.
Figure 11:
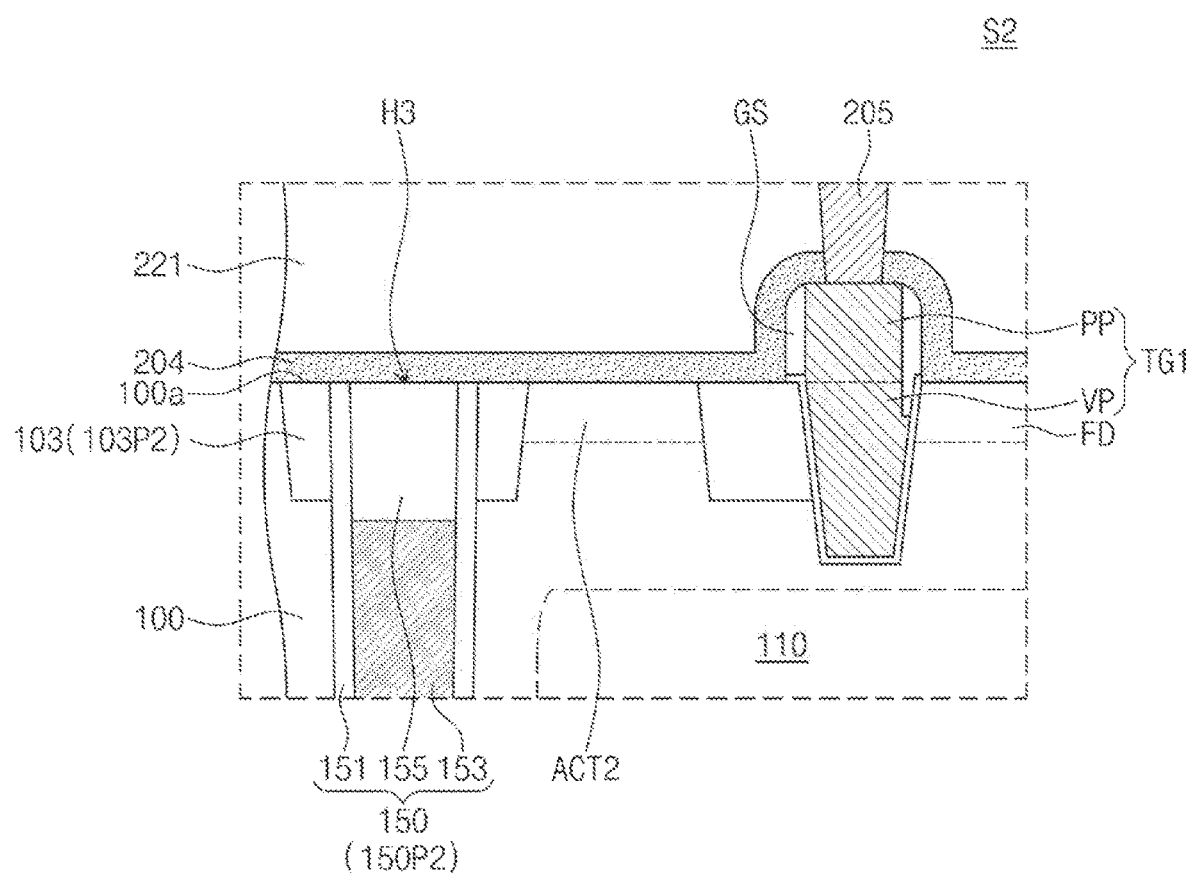
FIG. 11 illustrates an enlarged cross-sectional view showing section S2 of FIG. 7.

FIG. 5 illustrates an enlarged plan view showing section Q of FIG. 3. FIG. 6 illustrates a cross-sectional view taken along line I-I' of FIG. 5. FIG. 7 illustrates a cross-sectional view taken along line II-II' of FIG. 5. FIG. 8 illustrates a cross-sectional view taken along line III-III' of FIG. 5. FIG. 9 illustrates an enlarged plan view showing section R of FIG. 5. FIG. 10 illustrates an enlarged cross-sectional view showing section S1 of FIG. 6. FIG. 11 illustrates an enlarged cross-sectional view showing section S2 of FIG. 7. For brevity of description, the following discussion will focus on the sensor chip 1000 of the image sensor.

Referring to FIGS. 5 to 11, an image sensor according to embodiments may include a photoelectric conversion layer 10, gate electrodes TG, RE, SEL, and SF, a first wiring layer 21, and an optical transmittance layer 30. The photoelectric conversion layer 10 may include a first substrate 100, a pixel separation pattern 150, and a device separation pattern 103.

The first substrate 100 may have a first surface (or a front surface) 100a and a second surface (or a rear surface) 10b opposite to the first surface 100a. Light may be incident on the second surface 100b of the first substrate 100. The first wiring layer 21 may be disposed on the first surface 100a of the first substrate 100, and the optical transmittance layer 30 may be disposed on the second surface 100b of the first substrate 100. The first substrate 100 may be a semiconductor substrate or a silicon-on-insulator (SOI) substrate. The semiconductor substrate may be, for example, a silicon substrate, a germanium substrate, or a silicon-germanium substrate. The first substrate 100 may include first conductivity type impurities. For example, the first conductivity type impurities may include p-type impurities, such as one or more of aluminum (Al), boron (B), indium (In), and gallium (Ga).

The first substrate 100 may include a plurality of unit pixels PX defined by a pixel separation pattern 150. The plurality of unit pixels PX may be arranged in a matrix shape along first and second directions D1 and D2 which intersect each other. The first substrate 100 may include photoelectric conversion regions 110. In the first substrate 100, the photoelectric conversion regions 110 may be provided in corresponding unit pixels PX. The photoelectric conversion regions 110 may be areas where second conductivity type impurities are doped into the first substrate 100. The second conductivity type impurities may have a conductivity type opposite to that of the first conductivity type impurities. The second conductivity type impurities may include n-type impurities, such as one or more of phosphorus, arsenic, bismuth, and antimony. The photoelectric conversion regions 110 may be disposed closer to the second surface 100b than to the first surface 100a. For example, each of the photoelectric conversion regions 110 may include a first section adjacent to the first surface 100a and a second section adjacent to the second surface 100b. The photoelectric conversion region 110 may have a difference in an impurity concentration between the first and second sections. Therefore, the photoelectric conversion region 110 may have a potential slope between the first and second surfaces 100a and 100b of the first substrate 100. Alternatively, the photoelectric conversion region 110 may have no potential slope between the first and second surfaces 100a and 100b of the first substrate 100.

The first substrate 100 and the photoelectric conversion region 110 may constitute a photodiode. For example, a photodiode may be constituted by a p-n junction between the first substrate 100 of the first conductivity type and the photoelectric conversion region 110 of the second conductivity type. The photoelectric conversion region 110 which constitutes the photodiode may generate and accumulate photo-charges in proportion to intensity of incident light.

The pixel separation pattern 150 may extend into a gap between the unit pixels PX of the first substrate 100. The pixel separation pattern 150 may have a grid or lattice structure. When viewed in plan, the pixel separation pattern 150 may completely surround each of the unit pixels PX. The pixel separation pattern 150 may be provided in a first trench TR1, and the first trench TR1 may be recessed from the first surface 100a of the first substrate 100. The pixel separation pattern 150 may extend from the first surface 100a toward the second surface 100b of the first substrate 100. The pixel separation pattern 150 may be a deep trench isolation (DTI) layer. The pixel separation pattern 150 may penetrate the first substrate 100. The pixel separation pattern 150 may have a vertical height substantially the same as a vertical thickness of the first substrate 100. For example, the pixel separation pattern 150 may have a width which gradually decreases as the pixel separation pattern 150 approaches the second surface 100b from the first surface 100a of the first substrate 100.

The pixel separation pattern 150 may include a first separation pattern 151, a second separation pattern 153, and a capping pattern 155. The first separation pattern 151 may be provided along a sidewall of the first trench TR1. The first separation pattern 151 may include, for example, one or more of a silicon-based dielectric material (e.g., silicon nitride, silicon oxide, and silicon oxynitride) and a high-k dielectric material (e.g., hafnium oxide and aluminum oxide). Alternatively, the first separation pattern 151 may include a plurality of layers, and the layers may include different materials from each other. The first separation pattern 151 may have a refractive index less than that of the first substrate 100. Accordingly, crosstalk may be prevented or reduced between the unit pixels PX of the first substrate 100.

The second separation pattern 153 may be provided in the first separation pattern 151. For example, the second separation pattern 153 may have a sidewall surrounded by the first separation pattern 151. The first separation pattern 151 may be interposed between the second separation pattern 153 and the first substrate 100. The first separation pattern 151 may separate the second separation pattern 153 from the first substrate 100. Therefore, when the image sensor operates, the second separation pattern 153 may be electrically separated from the first substrate 100. The second separation pattern 153 may include a crystalline semiconductor material, such as polycrystalline silicon. For example, the second separation pattern 153 may include dopants, and the dopants may include impurities having the first conductivity type or the second conductivity type. For example, the second separation pattern 153 may include doped polycrystalline silicon. For another example, the second separation pattern 153 may include an undoped crystalline semiconductor material. The second separation pattern 153 may include, for example, undoped polycrystalline silicon. The term "undoped" may mean that no doping process is intentionally performed. The dopants may include n-type dopants or p-type dopants.

The capping pattern 155 may be provided on a top surface of the second separation pattern 153. The capping pattern 155 may be adjacent to the first surface 100a of the first substrate 100. The capping pattern 155 may have a top surface coplanar with the first surface 100a of the first substrate 100. The capping pattern 155 may include a non-conductive material. For example, the capping pattern 155 may include one or more of a silicon-based dielectric material (e.g., silicon nitride, silicon oxide, and silicon oxynitride) and a high-k dielectric material (e.g., hafnium oxide and aluminum oxide. The pixel separation pattern 150 may thus prevent photo-charges generated from light incident onto each unit pixel PX from drifting into neighboring unit pixels PX. For example, the pixel separation pattern 150 may prevent crosstalk between the unit pixels PX.

The device separation pattern 103 may be provided in the first substrate 100. For example, the device separation pattern 103 may be provided in a second trench TR2, and the second trench TR2 may be recessed from the first surface 100a of the first substrate 100. The device separation pattern 103 may be a shallow trench isolation (STI) layer. The device separation pattern 103 may define first active patterns ACT1 and second active patterns ACT2. The device separation pattern 103 may have a bottom surface which is provided in the first substrate 100. The device separation pattern 103 may have a width which gradually decreases as the device separation pattern 103 approaches the second surface 100b from the first surface 100a of the first substrate 100. The bottom surface of the device separation pattern 103 may be vertically spaced apart from the photoelectric conversion regions 110. The pixel separation pattern 150 may be connected to the device separation pattern 103. At least a portion of the device separation pattern 103 may be disposed on and connected to an upper sidewall of the pixel separation pattern 150. A stepwise structure may be formed on a sidewall and the bottom surface of the device separation pattern 103 and a sidewall of the pixel separation pattern 150. The device separation pattern 103 may have a depth less than that of the pixel separation pattern 150. The device separation pattern 103 may include, for example, one or more of silicon oxide, silicon nitride, and silicon oxynitride.

Each of the unit pixels PX may include the first active pattern ACT1 and the second active pattern ACT2 which are defined by the device separation pattern 103. The first and second active patterns ACT1 and ACT2 may have their planar shapes which are variously changed without being limited to that shown in FIG. 5.

The first substrate 100 may be provided on its first surface 100a with the transfer transistor TX, the source follower transistor SX, the reset transistor RX, and the selection transistor AX which are discussed with reference to FIG. 2. The gate electrodes TG, SEL, SF, and RG respectively of the transistors TX, AX, SX, and RX may be provided on the first surface 100a of the first substrate 100. The gate electrodes TG, SEL, SF, and RG may include a transfer gate TG, a selection gate SEL, a source follower gate SF, and a reset gate RG.

The transfer transistor TX may be provided on the first active pattern ACT1 of each of the unit pixels PX. The transfer transistor TX may be electrically connected to the photoelectric conversion region 110. The transfer transistor TX may include a floating diffusion region FD and the transfer gate TG on the first active pattern ACT1. The transfer gate TG may include a buried part VP which is inserted into the first substrate 100 and a protruding part PP which protrudes upwardly from the first surface 100a of the first substrate 100. A gate spacer GS may be provided on a sidewall of the protruding part PP. A gate dielectric layer GI may be interposed between the transfer gate TG and the first substrate 100. The floating diffusion region FD may be positioned in the first active pattern ACT1 on a side of the transfer gate TG. The floating diffusion region FD may have the second conductivity type (e.g., n-type) opposite to that of the first substrate 100. The gate spacer GS may include one or more of a silicon oxide layer, a silicon nitride layer, or a silicon oxynitride layer. The gate dielectric layer GI may include a silicon oxide layer or a high-k dielectric layer whose dielectric constant is greater than that of a silicon oxide layer.

The source follower transistor SX and the selection transistor AX may be provided on each of the first active patterns ACT1 of the unit pixels PX. The reset transistor RX may be provided on each of the second active patterns ACT2 of the unit pixels PX. The gate dielectric layer GI may be interposed between the first substrate 100 and each of the transfer gate TG, the selection gate SEL, the source follower gate SF, and the reset gate RG.

The first wiring layer 21 may include dielectric layers 221, 222, and 223, wiring lines 212 and 213, and vias 215. The dielectric layers 221 and 222 may include a first dielectric layer 221 and second dielectric layers 222 and 223. The first dielectric layer 221 may cover the first surface 100a of the first substrate 100. The first dielectric layer 221 may be provided between the wiring lines 212 and 213 and the first surface 100a of the first substrate 100, covering the gate electrodes TG, SEL, SF, and RG. The second dielectric layers 222 and 223 may be stacked on the first dielectric layer 221. The first and second dielectric layers 221, 222, and 223 may include a non-conductive material. For example, the first and second dielectric layers 221, 222, and 223 may include a silicon-based dielectric material, such as one or more of silicon oxide, silicon nitride, and silicon oxynitride.

An etch stop layer 204 may be provided between the first dielectric layer 221 and the first surface 100a of the first substrate 100. The etch stop layer 204 may cover the gate electrodes TG, SEL, SF, and RG. The etch stop layer 204 may include one or more of silicon nitride, silicon oxynitride, and silicon carbonitride. For example, the etch stop layer 204 may include two silicon nitride layers whose densities are different from each other.

The wiring lines 212 and 213 may be provided on the first dielectric layer 221. For example, the wiring lines 212 and 213 may be disposed in the second dielectric layers 222 and 223 stacked on the first surface 100a of the first substrate 100. The wiring lines 212 and 213 may be vertically connected through the vias 215 to the transfer transistors TX, the source follower transistors SX, the reset transistors RX, and the selection transistors AX. Electrical signals converted in the photoelectric conversion regions 110 may be transferred through the first wiring layer 21 to a circuit chip. The vias 215 may include lower vias 205 connected to either the transfer gates TG or the floating diffusion regions FD. The wiring lines 212 and 213 and the vias 215 may include a metallic material, such as copper (Cu).

The optical transmittance layer 30 may include color filters 303 and micro-lenses 307. The optical transmittance layer 30 may focus and filter externally incident light, and the photoelectric conversion layer 10 may be provided with the focused and filtered light. For example, the color filters 303 and the micro-lenses 307 may be provided on the second surface 100b of the first substrate 100. The color filters 303 may be disposed on corresponding unit pixels PX. The micro-lenses 307 may be disposed on corresponding color filters 303. An antireflective layer 132 and first and second lower dielectric layers 134 and 136 may be disposed between the color filters 303 and the second surface 100b of the first substrate 100. The antireflective layer 132 may prevent light reflection such that the photoelectric conversion regions 110 may be allowed to readily receive light incident onto the second surface 100b of the first substrate 100. A third lower dielectric layer 305 may be disposed between the color filters 303 and the micro-lenses 307. Each of the first and second lower dielectric layers 134 and 136 may include one or more of a fixed charge layer, an adhesive layer, and a protective layer.

The color filters 303 may include primary color filters. The color filters 303 may include first, second, and third color filters which have different colors from each other. For example, the first, second, and third color filters may include green, red, and blue color filters. The first, second, and third color filters may be arranged in a Bayer pattern format. For another example, the first, second, and third color filters may include different colors such as cyan, magenta, or yellow.

Each of the micro-lenses 307 may have a convex shape to focus light which is incident onto the unit pixel PX. When viewed in plan, the micro-lenses 307 may overlap corresponding photoelectric conversion regions 110, but the embodiments are not limited thereto.

Referring to FIG. 5, the first substrate 100 may include pixel groups PG each of which includes a plurality of unit pixels PX. When viewed in plan, the pixel groups PG may be two-dimensionally arranged along rows and columns. A single pixel group PG may include a first unit pixel region PX1, a second unit pixel region PX2, a third unit pixel region PX3, and a fourth unit pixel region PX4. The pixel separation pattern 150 may differentiate the first, second, third, and fourth unit pixel regions PX1, PX2, PX3, and PX4 from each other. The first, second, third, and fourth unit pixel regions PX1, PX2, PX3, and PX4 may two-dimensionally arranged in two rows and two columns. The first unit pixel region PX1 may be spaced apart in the first direction D1 from the second unit pixel region PX2, and the third unit pixel region PX3 may be spaced apart in the second direction D2 from the first unit pixel region PX1. The fourth unit pixel region PX4 may be spaced in the second direction D2 from the second unit pixel region PX2. The pixel separation pattern 150 may include a first pixel separation part 150P1 between the first unit pixel region PX1 and the second unit pixel region PX2. The first pixel separation part 150P1 may extend into a gap between the third unit pixel region PX3 and the fourth unit pixel region PX4. The device separation pattern 103 may include a first part 103P1 adjacent to the first pixel separation part 150P1.

The pixel separation pattern 150 may include a third pixel separation part 150P3 between the first unit pixel region PX1 and the fourth unit pixel region PX4. The third pixel separation part 150P3 may extend into a gap between the second unit pixel region PX2 and the third unit pixel region PX3. The third pixel separation part 150P3 which extends in the first direction D1 may intersect the first pixel separation part 150P1 which extends in the second direction D2.

The pixel separation pattern 150 may include second pixel separation parts 150P2 which are spaced apart in the first direction D1 (or a direction opposite to the first direction D1) from the first pixel separation part 150P1 across the first unit pixel region PX1 or the second unit pixel region PX2. Similarly, the second pixel separation parts 150P2 may include segments which are spaced apart in the first direction D1 (or a direction opposite to the first direction D1) from the first pixel separation part 150P1 across the third unit pixel region PX3 or the fourth unit pixel region PX4. For example, the second pixel separation parts 150P2 may surround the pixel group PG.

The device separation pattern 103 may include a second part 103P2 and a third part 103P3 which are respectively adjacent to the second pixel separation part 150P2 and the third pixel separation part 150P3.

The first unit pixel region PX1 and the second unit pixel region PX2 may have their mirror-symmetrical structures about the first pixel separation part 150P1. The third unit pixel region PX3 and the first unit pixel region PX1 may have their mirror-symmetrical structures about the third pixel separation part 150P3. For example, as shown in FIG. 5, a first transfer gate TG1 of the first unit pixel region PX1 may have a mirror-symmetrical shape with respect to a second transfer gate TG2 of the second unit pixel region PX2.

The transfer gates TG disposed along the first direction D1 may be arranged such that two neighboring transfer gates TG constitute a pair. For example, the first and second transfer gates TG1 and TG2 may be a nearest pair. In this case, a distance between the first transfer gate TG1 and the second transfer gate TG2 may be less than a distance between the second transfer gate TG2 and a fifth transfer gate TG5 of a fifth transfer gate TG5 which is illustrated by way of example in FIG. 5.

The first transfer gate TG1 and the second transfer gate TG2 may be provided therebetween with a recessed region RR which is recessed in a third direction D3 from the first surface 100a of the first substrate 100. For example, the first surface 100a of the first substrate 100 may be located at a second height H2, and a bottom surface of the recessed region RR may be located at a first height H1 lower than the second height H2. In this description below, a height of the recessed region RR may be explained as that of the bottom surface of the recessed region RR. The bottom surface of the recessed region RR may be defined as a top surface of the first pixel separation part 150P1 and a top surface of the first part 103P1 of the device separation pattern 103. For example, the top surface of the first pixel separation part 150P1 and the top surface of the first part 103P1 of the device separation pattern 103 may each include a segment at the first height H1. The etch stop layer 204 may conformally cover a sidewall and a bottom surface of the recessed region RR.

As shown in FIG. 5, the recessed region RR may be confinedly provided between two transfer gates TG which are adjacent to each other in the first direction D1. For example, the recessed region RR may be confinedly provided between the first transfer gate TG1 and the second transfer gate TG2. Similarly, the recessed region RR may also be provided between a third transfer gate TG3 of the third unit pixel region PX3 and a fourth transfer gate TG4 of the fourth unit pixel region PX4. As discussed above, the recessed region RR may be provided between two neighboring ones of the transfer gates TG which are disposed along the first direction D1, but may not be provided between two transfer gates TG which are not adjacent to each other. For example, the recessed region RR may also be provided between the second transfer gate TG2 of the second unit pixel region PX2 and the fifth transfer gate TG5 of the fifth unit pixel region PX5. In addition, the recessed region RR may not be provided between the transfer gates TG which are adjacent to each other in the second direction D2.

The recessed region RR may be provided on neither the second pixel separation part 150P2 nor the third pixel separation part 150P3. For example, the second pixel separation part 150P2 may have a top surface at the second height H2 which is higher than the first height H1 and is substantially the same as a height of the first surface 100a of the first substrate 100. In addition, the second part 103P2 of the device separation pattern 103 may have a top surface at the second height H2.

Similarly, the third pixel separation part 150P3 may have a top surface at a third height H3 which is higher than the first height H1 and is substantially the same as a height of the first surface 100a of the first substrate 100. The third height H3 may be substantially the same as the second height H2. In addition, the third part 103P3 of the device separation pattern 103 may have a top surface at the third height H3.

Between the unit pixels PX adjacent to each other in the first direction D1, the recessed region RR may be confinedly provided between two transfer gates TG which are adjacent to each other in the first direction D1, but may not be provided on other locations. For example, the recessed region RR may not be provided on a region, or a non-recessed region NR, between a first floating diffusion region FD1 of the first unit pixel region PX1 and a second floating diffusion region FD2 of the second unit pixel region PX2. Similarly, the recessed region RR may not be provided between a floating diffusion region FD of the third unit pixel region PX3 and a floating diffusion region FD of the fourth unit pixel region PX4. Therefore, in the non-recessed region NR between the first and second floating diffusion regions FD1 and FD2, the first pixel separation part 150P1 and the first part 103P1 of the device separation pattern 103 may each have a top surface at the second height H2 which is higher than the first height H1 and is substantially the same as a height of the first surface 100a of the first substrate 100.

As shown in FIG. 10, the buried part VP of the transfer gate TG may have a thickness t1 greater than a thickness t2 of the protruding part PP of the transfer gate TG. For example, the thickness t1 of the buried part VP may range from about 3,500 Å to about 5,000 Å, and the thickness t2 of the protruding part PP may range from about 1,000 Å to about 1,400 Å. Based on the second height H2 of the first surface 100a of the first substrate 100, the recessed region RR may have a depth which corresponds to a distance d1 between the top surface of the third part 103P3 of the device separation pattern 103 and the top surface of the first pixel separation part 150P1, and the distance d1 or the depth of the recessed region RR may be about 15% to about 35% of the thickness t1 of the buried part VP. For example, the depth of the recessed region RR may range from about 600 Å to about 12,000 Å.

As shown in FIG. 9, the floating diffusion region FD may be adjacent in the second direction D2 to the transfer gate TG. The buried part VP of the transfer gate TG may have a first sidewall TS1 adjacent to the floating diffusion region FD, and the first sidewall TS1 and a second sidewall TS2 of the floating diffusion region FD may intersect at an angle α equal to or greater than about 90 degrees. The second sidewall TS2 of the floating diffusion region FD may be the same as a sidewall of the device separation pattern 103, which sidewall defines the second sidewall TS2. The buried part VP of the transfer gate TG may have a sidewall which is positioned at a location in contact with the floating diffusion region FD and is spaced apart at a spacing distance DS from a sidewall of the protruding part PP. The above-mentioned shape of the transfer gate TG may reduce an electric field concentration at a location where the transfer gate TG meets the floating diffusion region FD.

Figure 12:
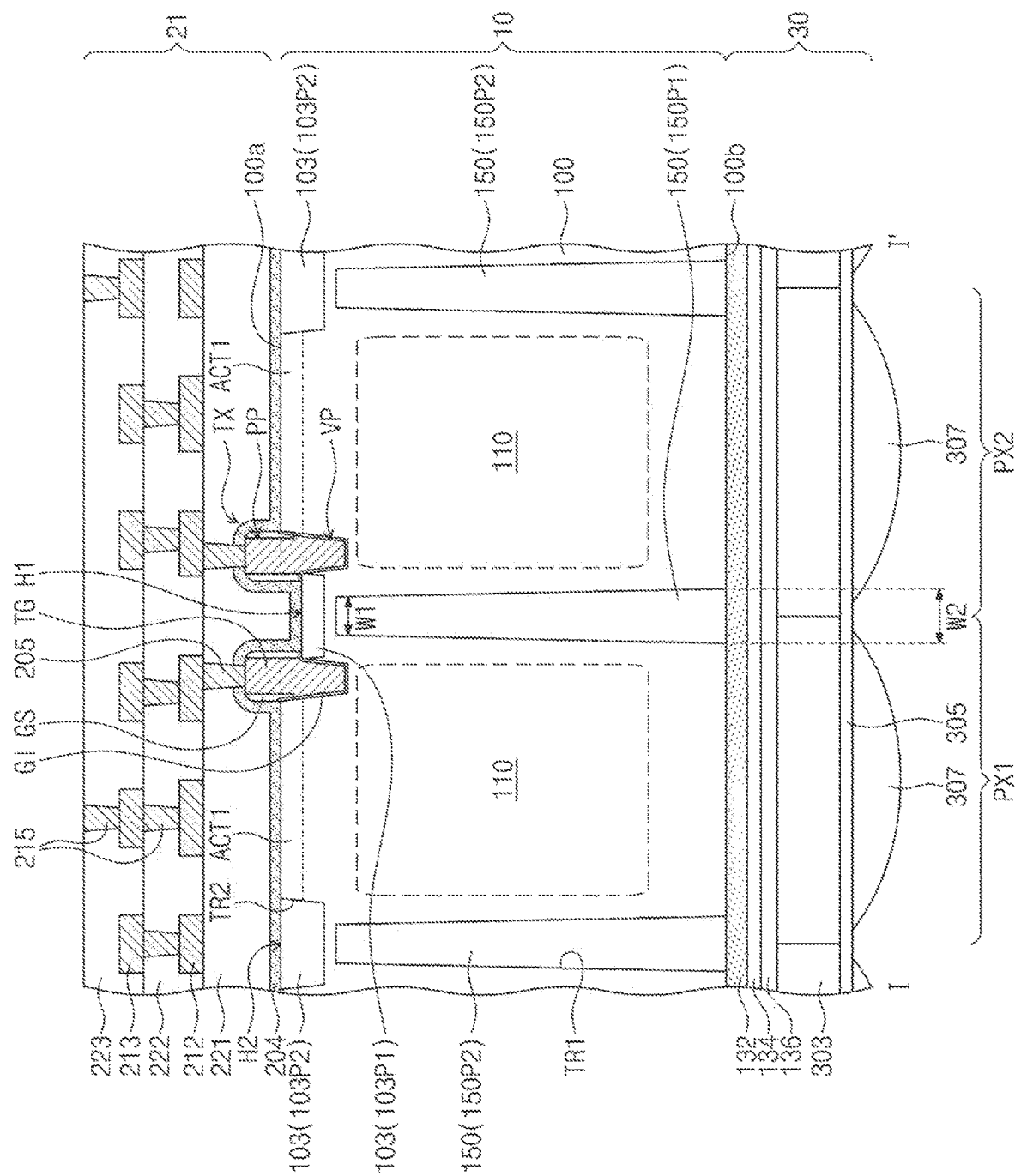
FIGS. 12 and 13 illustrate cross-sectional views respectively taken along lines I-I' and II-II' of FIG. 5, showing an image sensor according to embodiments.
Figure 13:
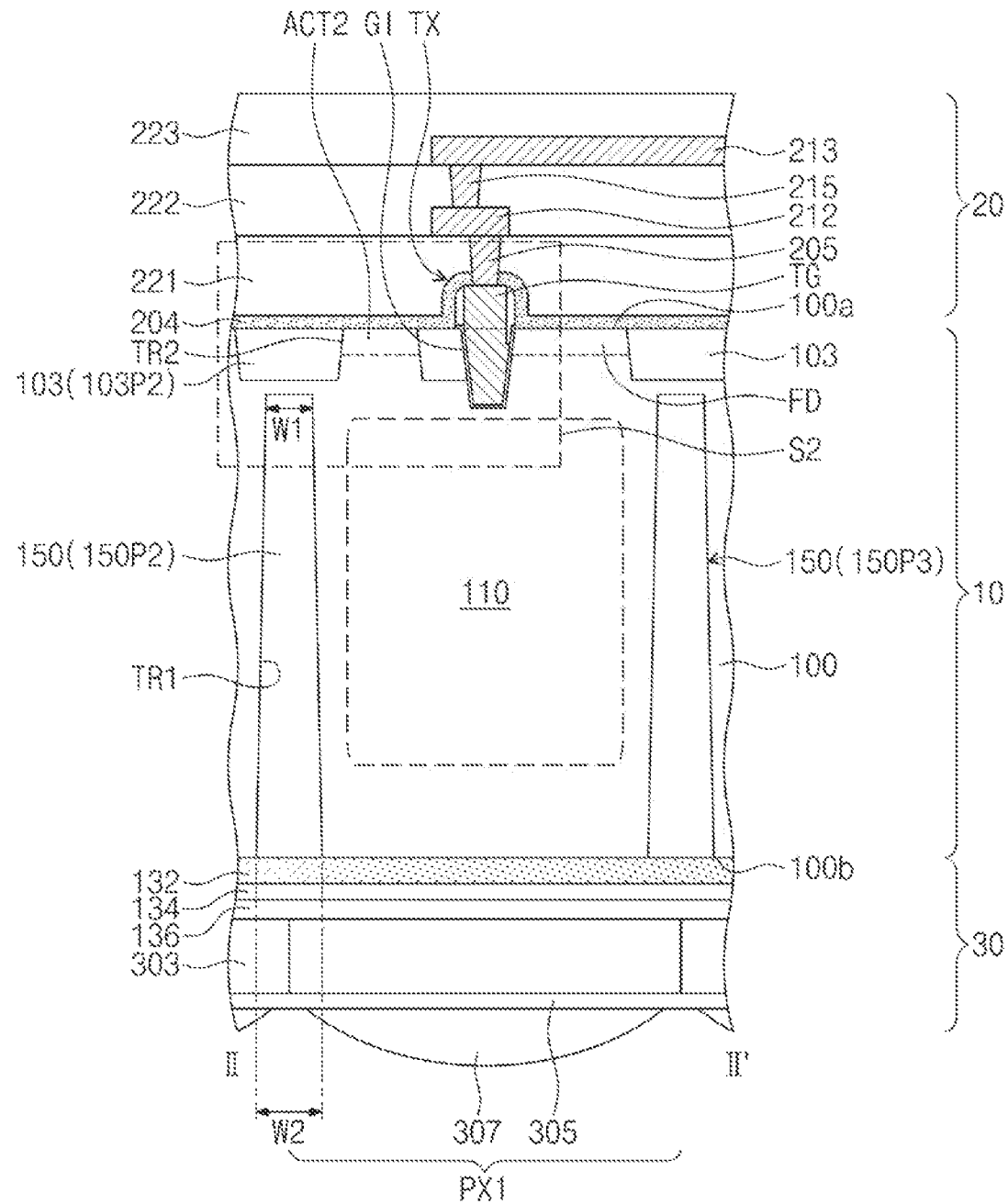

FIGS. 12 and 13 illustrate cross-sectional views respectively taken along lines I-I' and II-II' of FIG. 5, showing an image sensor according to embodiments. A duplicate description will be omitted below.

Referring to FIGS. 12 and 13, the pixel separation pattern 150 may be provided in the first trench TR1. The first trench TR1 may be recessed from the second surface 100b of the first substrate 100. The pixel separation pattern 150 may have a width W2 at its bottom surface greater than a width W1 at its top surface. The bottom surface of the pixel separation pattern 150 may be substantially coplanar with the second surface 100b of the first substrate 100. The pixel separation pattern 150 may penetrate the second surface 100b of the first substrate 100. The top surface of the pixel separation pattern 150 may be disposed in the first substrate 100. Therefore, the pixel separation pattern 150 may be vertically spaced apart from the first surface 100a of the first substrate 100. Alternatively, the pixel separation pattern 150 may be connected to the first surface 100a of the first substrate 100. Differently from that discussed with reference to FIGS. 6 to 8, the pixel separation pattern 150 may not include the second separation pattern 153. The pixel separation pattern 150 may not include a crystalline semiconductor material, such as polysilicon.

FIGS. 14, 16, 18, 20, and 22 illustrate cross-sectional views taken along line I-I' of FIG. 5, showing a method of fabricating an image sensor according to embodiments. FIGS. 15, 17, 19, 21, and 23 illustrate cross-sectional views taken along line II-II' of FIG. 5, showing the method of fabricating the image sensor according to the embodiments.

Figure 14:
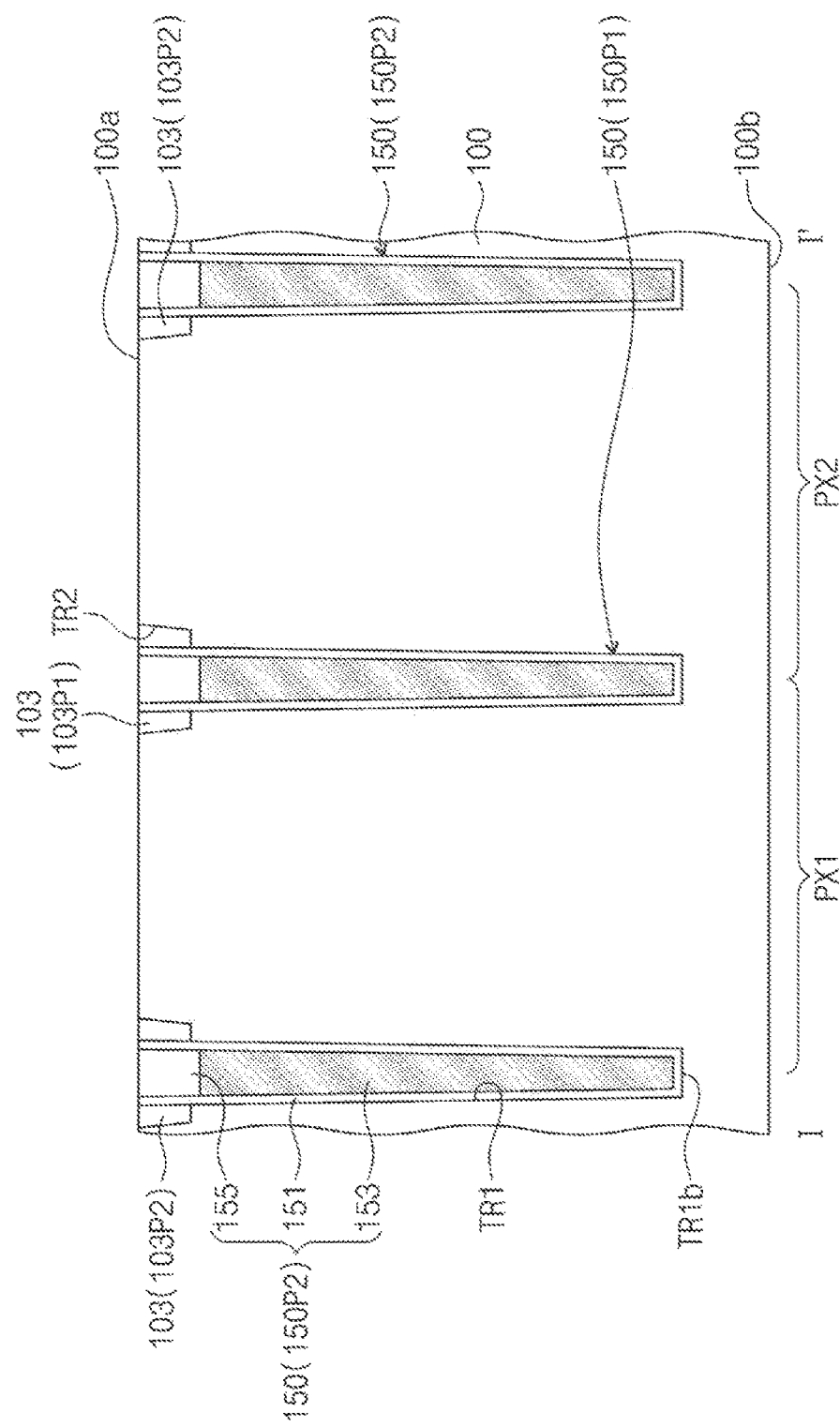
FIGS. 14, 16, 18, 20, and 22 illustrate cross-sectional views taken along line I-I' of FIG. 5, showing a method of fabricating an image sensor according to embodiments.
Figure 15:
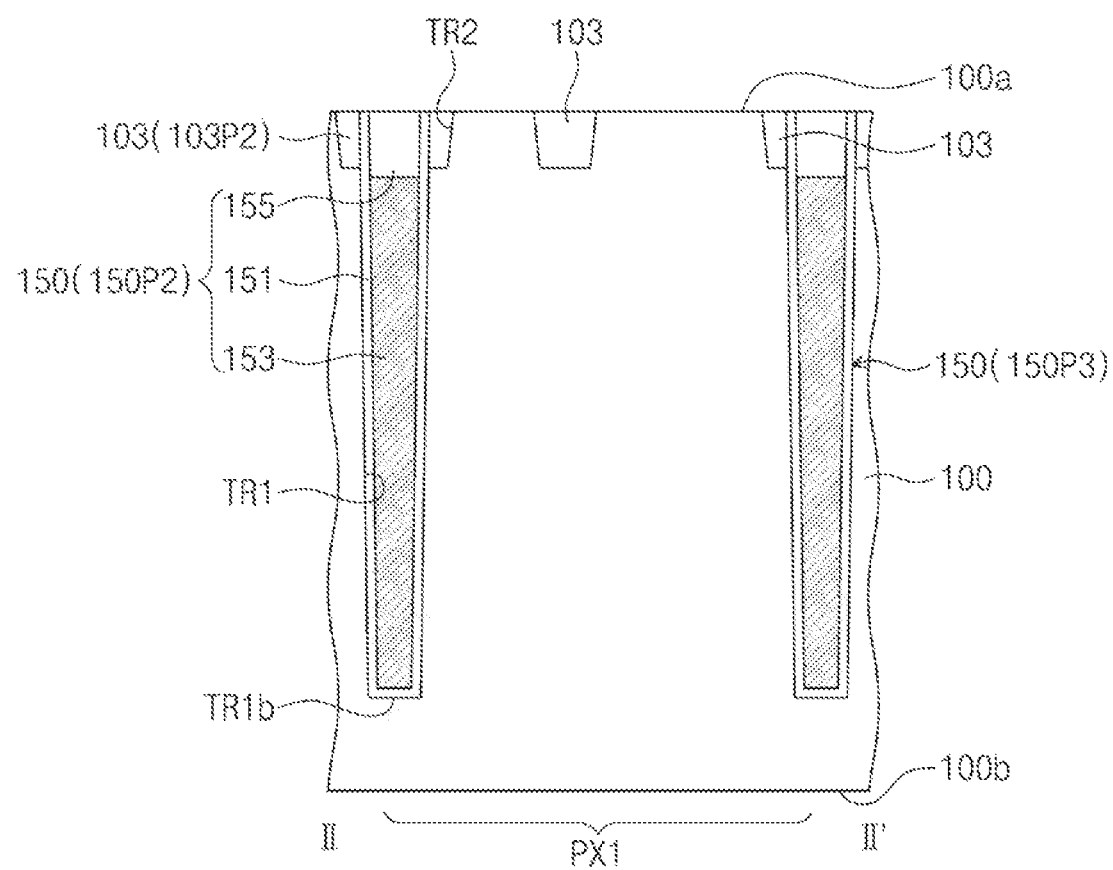
FIGS. 15, 17, 19, 21, and 23 illustrate cross-sectional views taken along line II-II' of FIG. 5, showing the method of fabricating the image sensor according to the embodiments.

Referring to FIGS. 5, 14, and 15, a first substrate 100 may be prepared to have a first surface 100a and a second surface 100b. The first substrate 100 may include impurities of a first conductivity type (e.g., p-type). For example, the first substrate 100 may be a substrate in which an epitaxial layer of the first conductivity type is formed on a bulk silicon substrate of the first conductivity type. For another example, the first substrate 100 may be a bulk substrate which includes a well of the first conductivity type.

A pixel separation pattern 150 and a device separation pattern 103 may be formed on the first surface 100a of the first substrate 100. The device separation pattern 103 may be formed in a second trench TR2. The pixel separation pattern 150 may be formed in the first trench TR1. The first trench TR1 may be formed after a dielectric layer for forming the device separation pattern 103 is formed to cover the second trench TR2. As a result, the pixel separation pattern 150 may be formed to have a shape which penetrates the device separation pattern 103. The device separation pattern 103 may include silicon oxide or silicon oxynitride. The first trench TR1 may have a bottom surface TR1b spaced apart from the second surface 100b of the first substrate 100.

The pixel separation pattern 150 may be formed by sequentially depositing layers to form a first separation pattern 151, a second separation pattern 153, and a capping pattern 155, and then performing a planarization process. For example, the first separation pattern 151 may include one or more of silicon oxide, silicon nitride, or silicon oxynitride. The second separation pattern 153 may include, for example, polysilicon. The second separation pattern 153 may be formed by performing a doping process, such as beam ion implantation or plasma doping (PLAD). The capping pattern 155 may include one or more of silicon oxide, silicon nitride, and silicon oxynitride.

Figure 16:
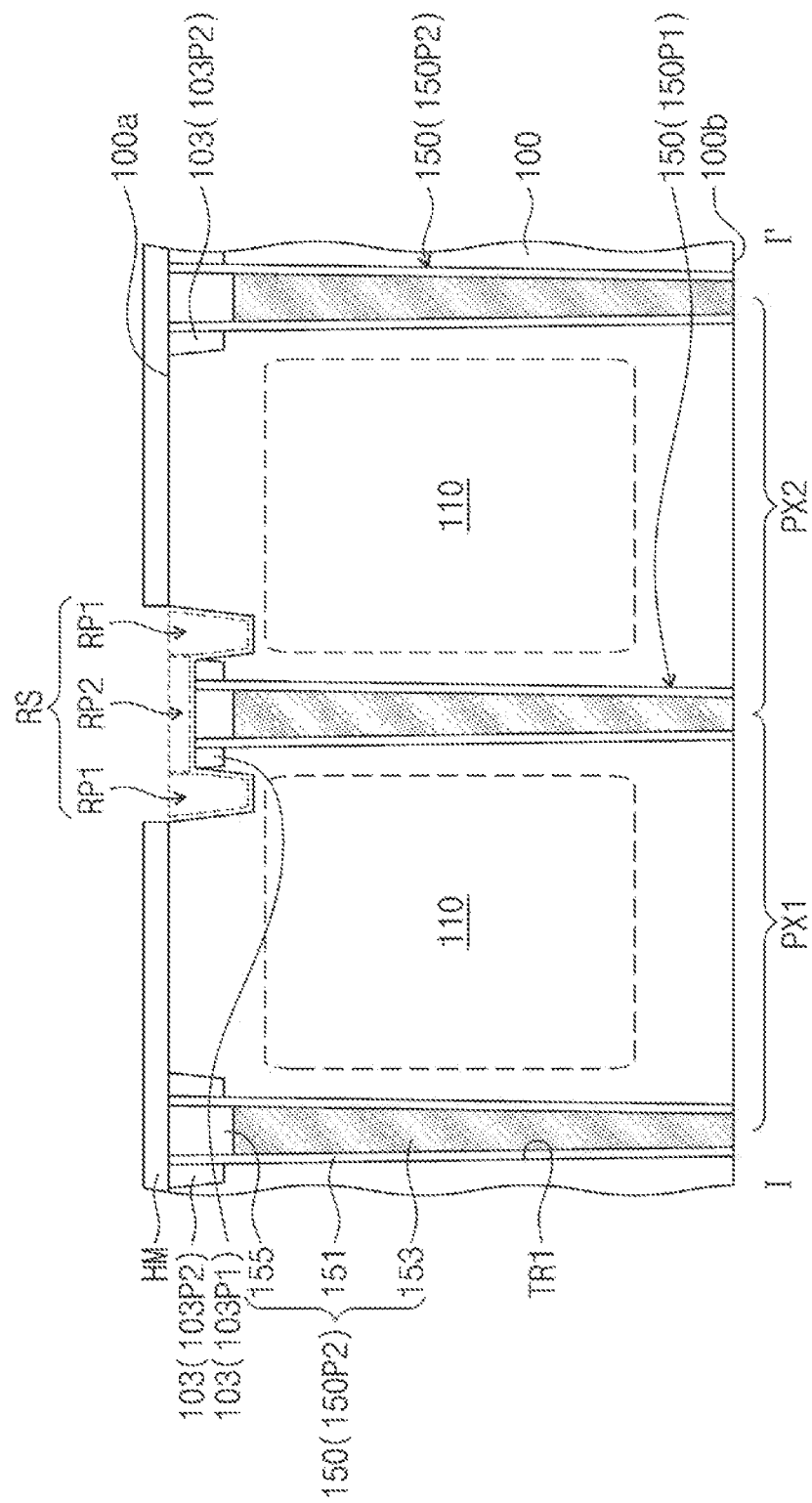
Figure 17:
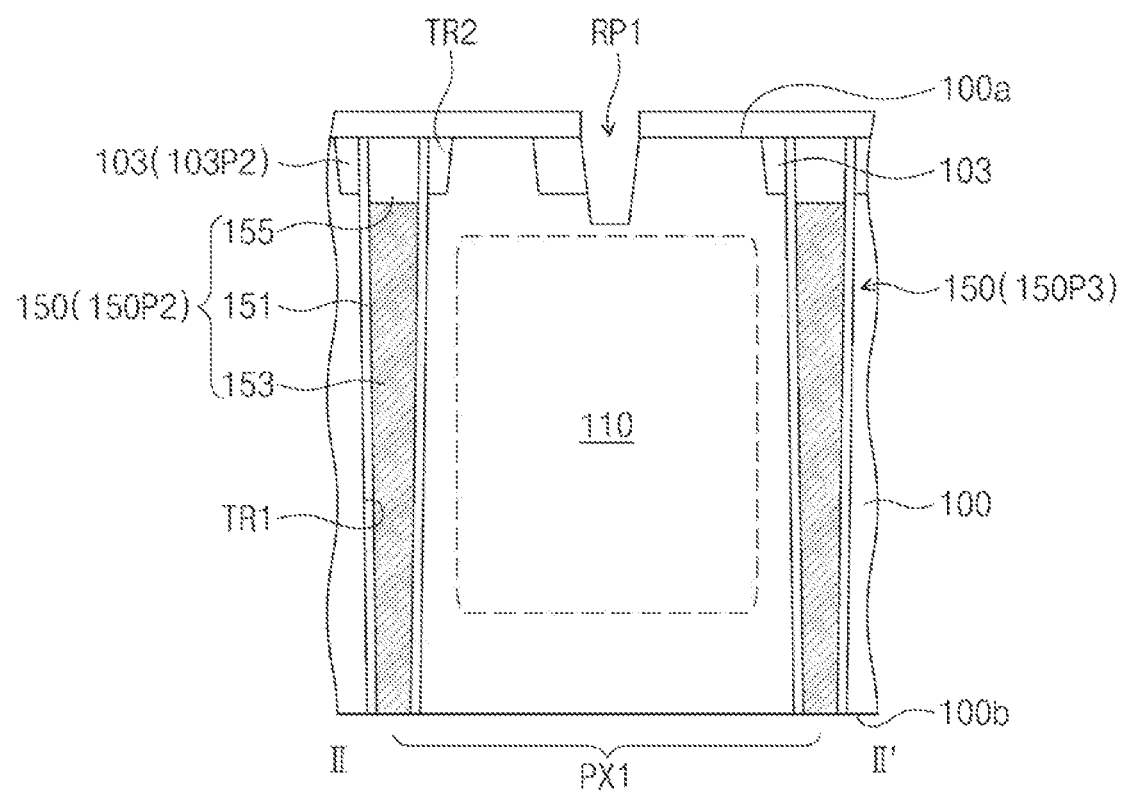

Referring to FIGS. 5, 16, and 17, unit pixels PX may be doped with impurities to form photoelectric conversion regions 110 in corresponding unit pixels PX. The photoelectric conversion regions 110 may have a second conductivity type (e.g., n-type) different from the first conductivity type (e.g., p-type). A thinning process may be performed in which a portion of the first substrate 100 is removed to reduce a vertical thickness of the first substrate 100. The thinning process may include grinding or polishing the second surface 100b of the first substrate 100 and/or anisotropically or isotropically etch the second surface 100b of the first substrate 100. Afterwards, an anisotropic or isotropic etching process may be performed to remove remaining surface defects of the first substrate 100.

As the thinning process is performed on the second surface 100b of the first substrate 100, it may be possible to expose bottom surface of the first and second separation patterns 151 and 153. The bottom surfaces of the first and second separation patterns 151 and 153 may be located at substantially the same level as that of the second surface 100b of the first substrate 100.

Transistors may be formed on corresponding unit pixels PX. The formation of the transistors may include forming gate electrodes such as transfer gates TG. The formation of the transfer gate TG may include forming a recessed part RS on the first surface 100a of the first substrate 100. The formation of the recessed part RS may include forming a hardmask pattern HM on the first surface 100a of the first substrate 100. The hardmask pattern HM may expose regions where the transfer gates TG will be formed, and may also expose a region between a pair of neighboring transfer gates TG. For example, the hardmask pattern HM may include a silicon nitride layer or a silicon oxynitride layer. The formation of the hardmask pattern HM may include forming a hardmask layer which covers the first surface 100a of the first substrate 100, and then using a photoresist pattern to pattern the hardmask layer. The recessed part RS formed as described above may include first recessed parts RP1 where the transfer gates TG will be formed, and may also include a second recessed part RP2 between the first recessed parts RP1. The first recessed parts RP1 may be regions in which the transfer gates TG will be formed and which have their depths relatively greater than that of the second recessed part RP2. The second recessed part RP2 may be a recessed region of an upper portion of the device separation pattern 103 and of an upper portion of a first pixel separation part 150P1 and may be shallower than the first recessed part RP1. The first recessed part RP1 and the second recessed part RP2 may be simultaneously formed in the same etching process. The difference in depth between the first and second recessed parts RP1 and PR2 may be attributed to a difference in etch rate between etch-target materials. For example, the first recessed parts RP1 may be formed by etching a silicon layer which constitutes the first substrate 100, the second recessed part RP2 may be formed by etching the first separation pattern 151, the capping pattern 155, and the device separation pattern 103 which are formed of a silicon-based dielectric material, and the present etching process may be performed using a recipe in which a silicon layer is etched at a relatively high etch rate. The etching process for forming the recessed part RS may include a plurality of etching processes. For example, after the hardmask pattern HM is formed, a drying etching process and a wet etching process may be sequentially performed. A first part 103P1 of the device separation pattern 103, the first separation pattern 151, and the capping pattern 155 may have their top surfaces which constitute a bottom surface of the second recessed part RP2 and are substantially coplanar with each other.

Figure 18:
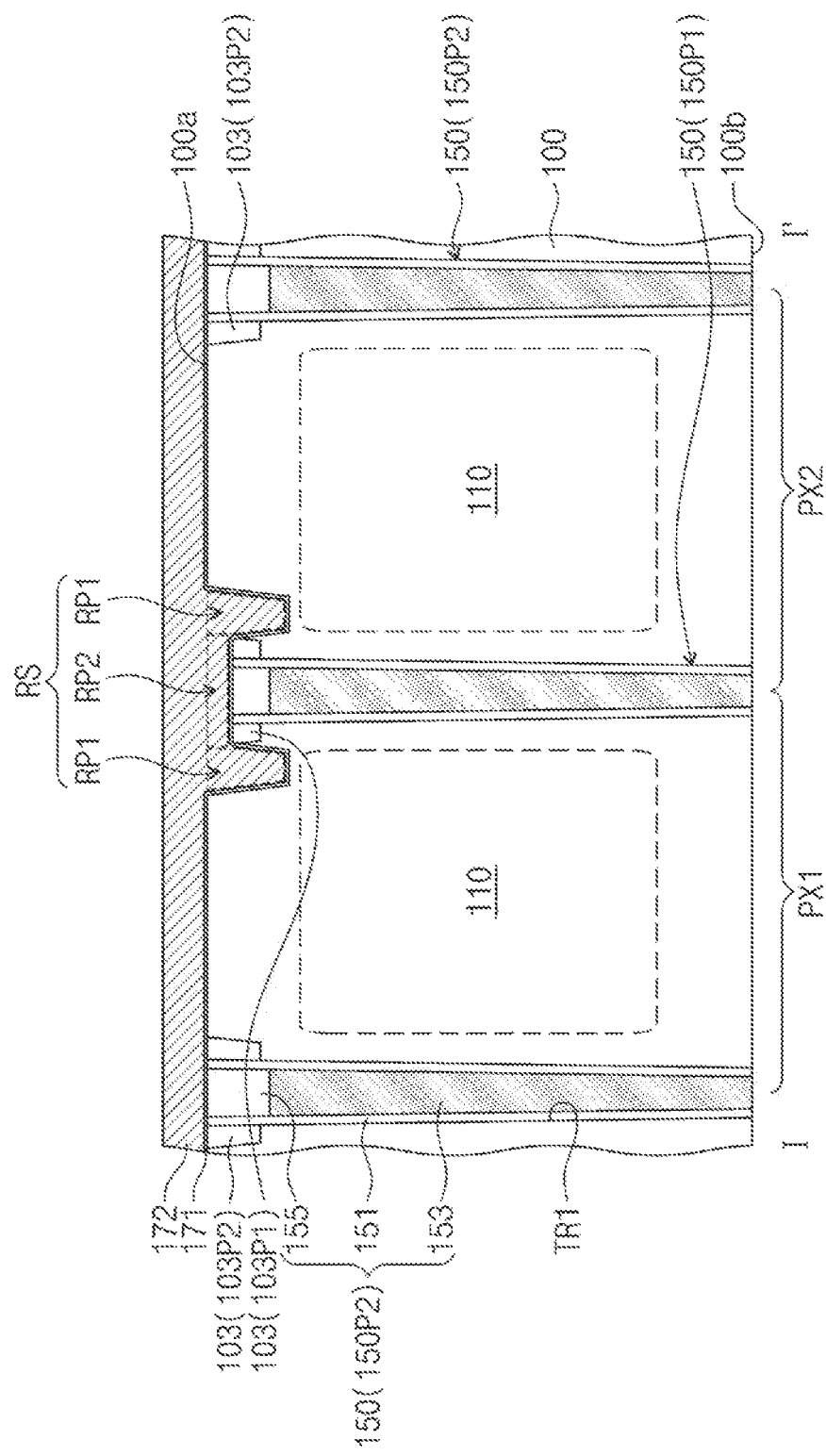
Figure 19:
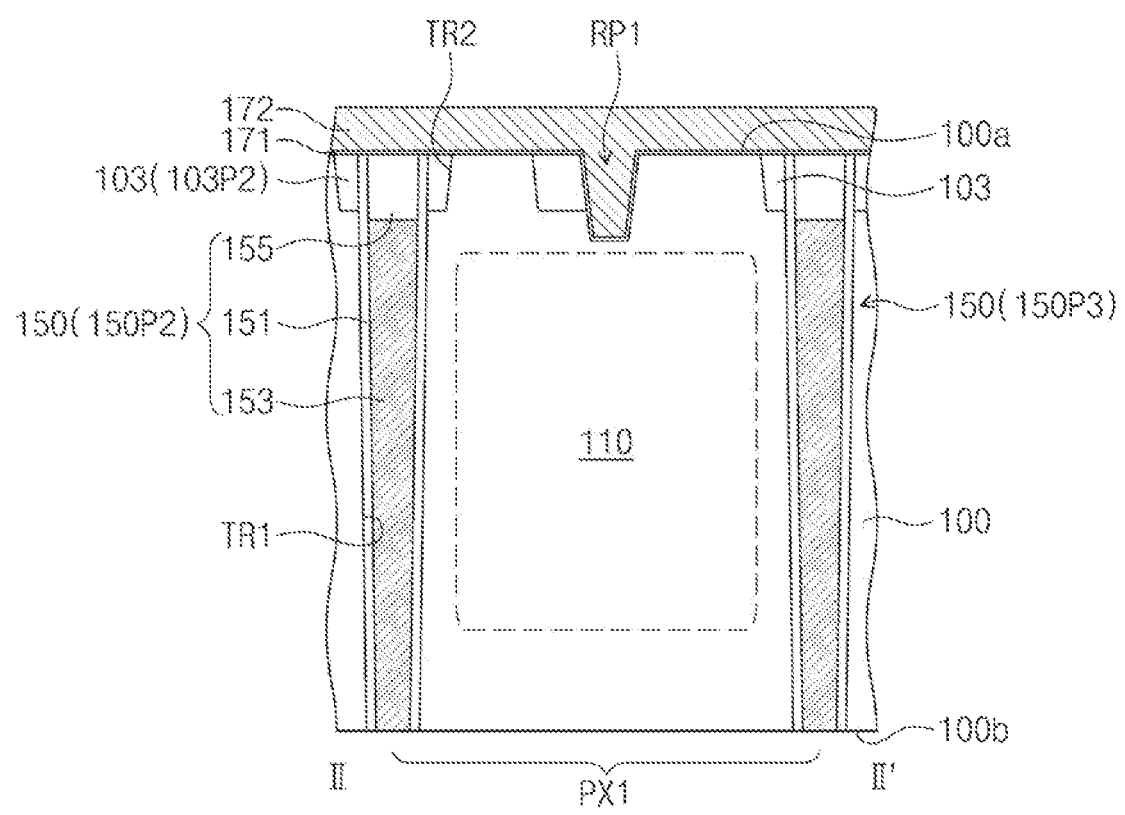

Referring to FIGS. 5, 18, and 19, after the hardmask pattern HM is removed, a preliminary gate dielectric layer 171 and a preliminary gate layer 172 may be sequentially formed to sequentially fill the recessed part RS. The preliminary gate dielectric layer 171 may be substantially conformally formed along the first surface 100a of the first substrate 100 and along a sidewall and the bottom surface of the recessed part RS, which first surface 100a is exposed due to the removal of the hardmask pattern HM. The preliminary gate dielectric layer 171 may be a silicon oxide layer or a high-k dielectric layer whose dielectric constant is greater than that of a silicon oxide layer. The preliminary gate layer 172 may be formed on the preliminary gate dielectric layer 171 to completely fill the recessed part RS. For example, the preliminary gate layer 172 may be formed of a semiconductor material, such as polycrystalline silicon. The formation of the preliminary gate layer 172 may include a plurality of deposition and doping processes. For example, a first impurity implantation process may be performed after a first polycrystalline silicon layer is formed, and then a second impurity implantation process may be performed after a second polycrystalline silicon layer is formed. In this case, a native oxide layer may be formed between the first polycrystalline silicon layer and the second polycrystalline silicon layer, but the embodiments are not limited thereto.

Figure 20:
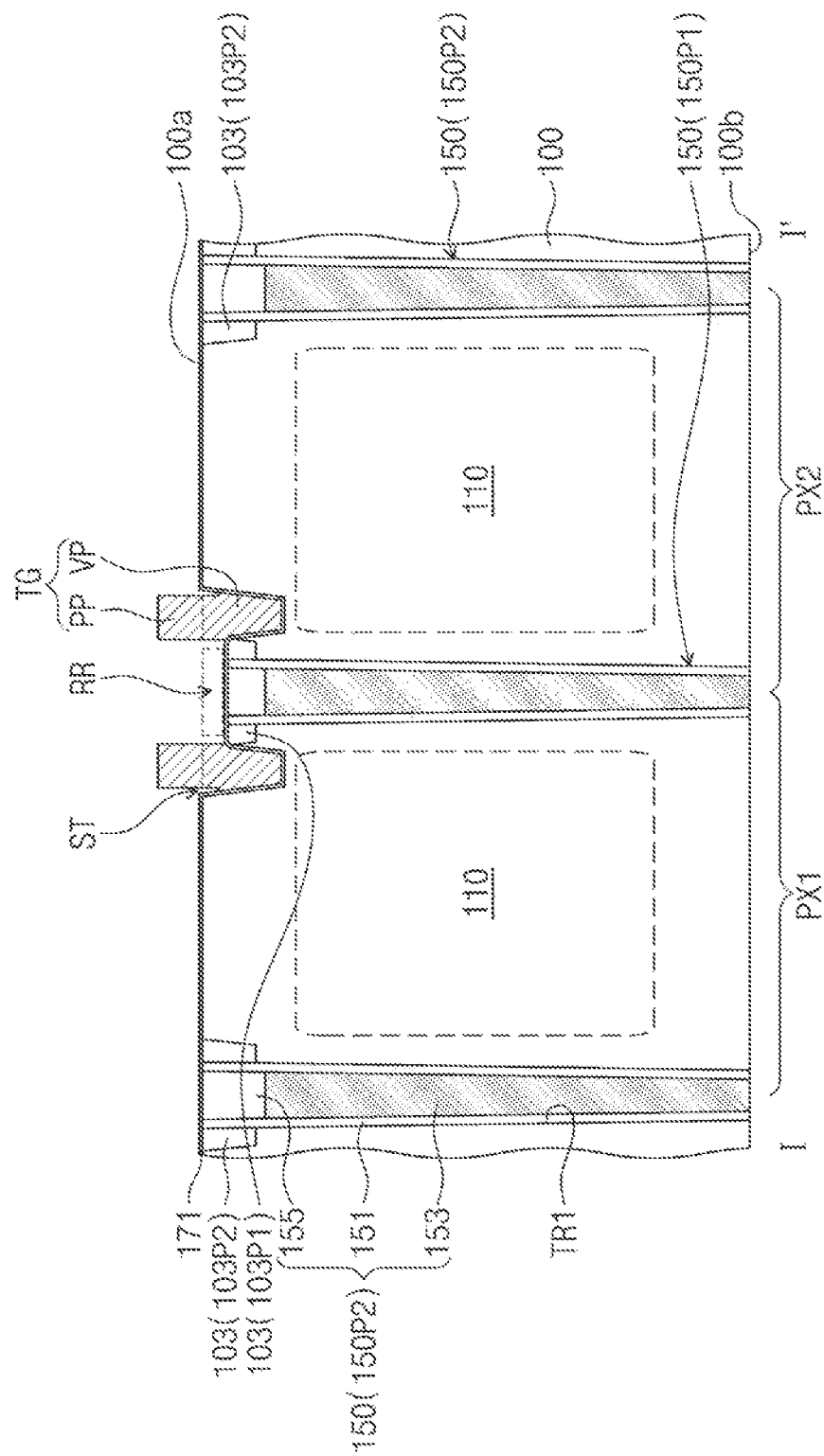
Figure 21:
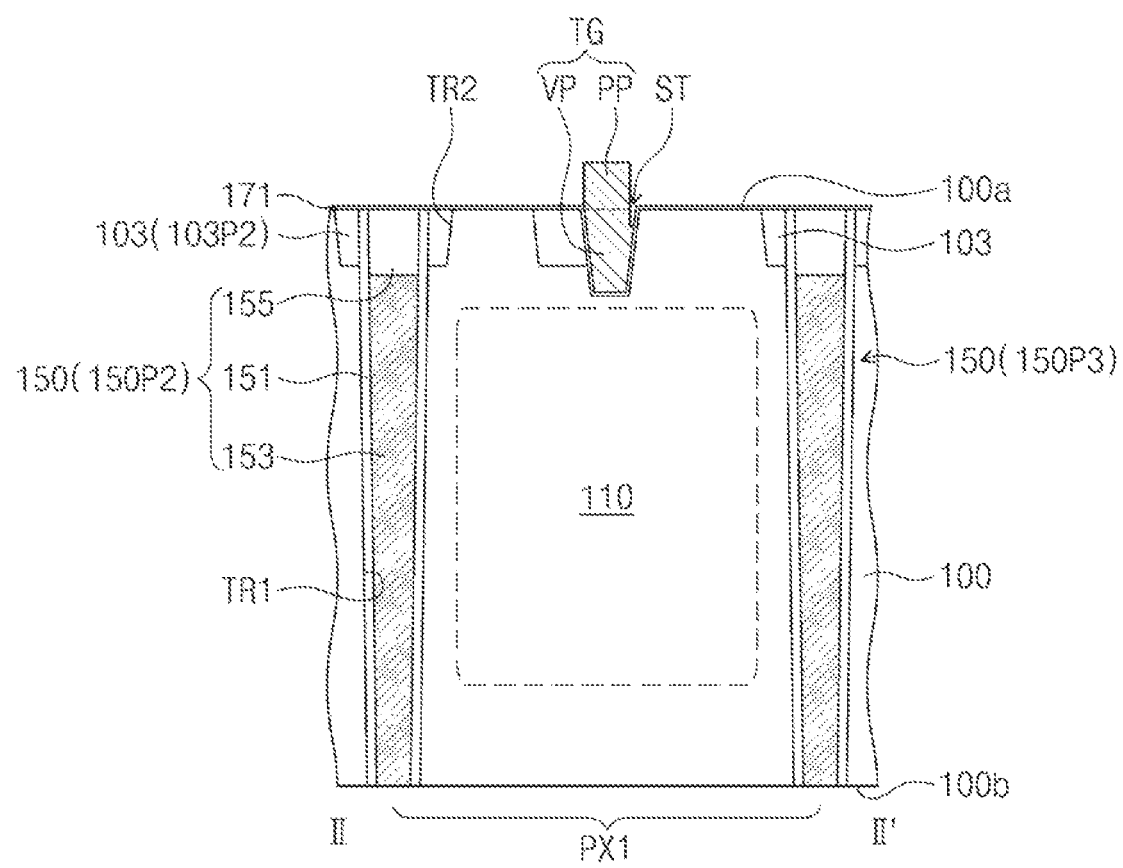

Referring to FIGS. 5, 20, and 21, the preliminary gate layer 172 may undergo a patterning process to form gate electrodes which include transfer gates TG. The preliminary gate layer 172 may be removed from the second recessed part RP2, and a recessed region RR may be formed to expose the preliminary gate dielectric layer 171. The transfer gate TG may be formed to include a buried part VP which fills the first recessed part RP1 and a protruding part PP which protrudes upwardly from the first surface 100a of the first substrate 100. The buried part VP may include at its upper portion a stepped structure ST which is formed by the patterning process.

Figure 22:
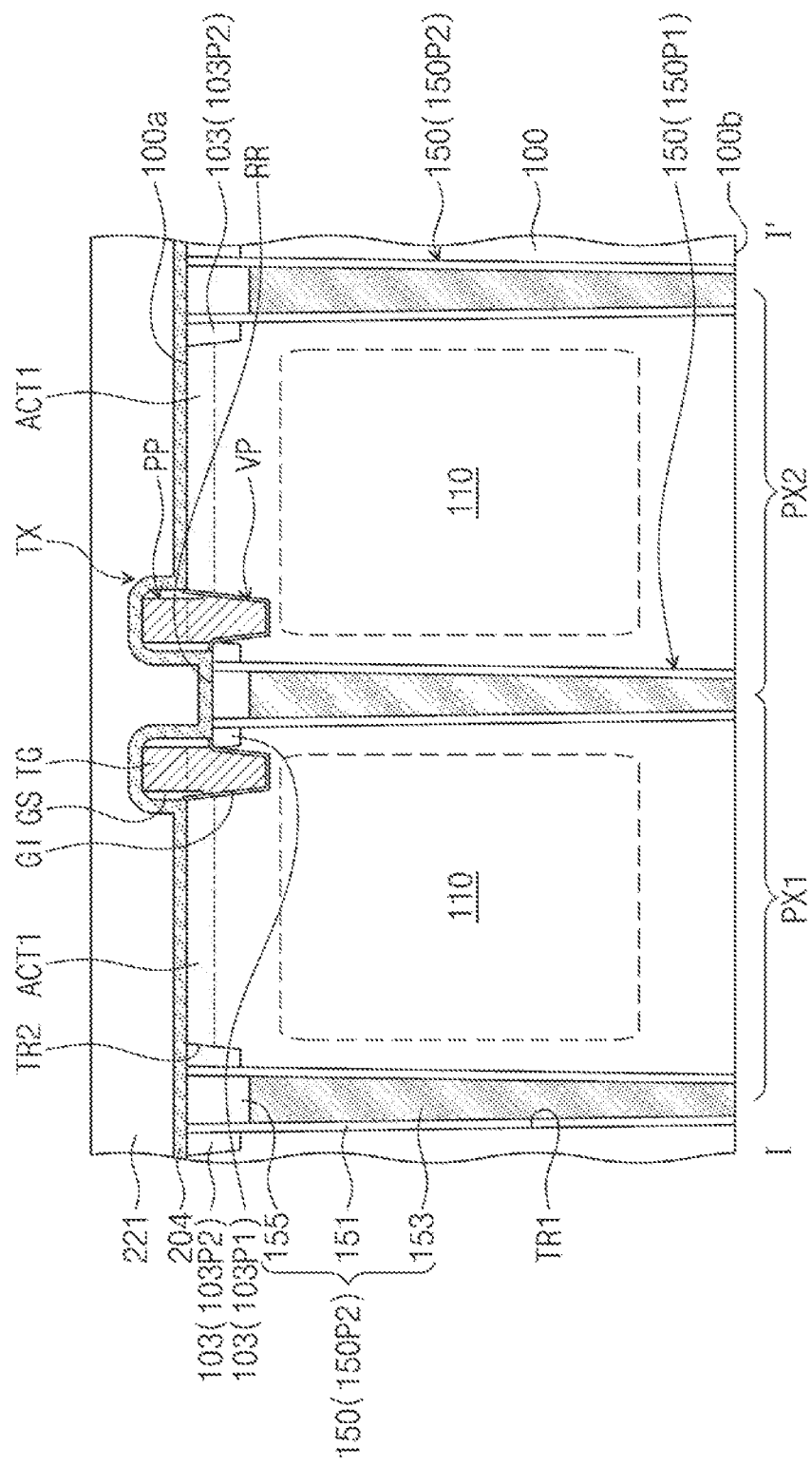
Figure 23:
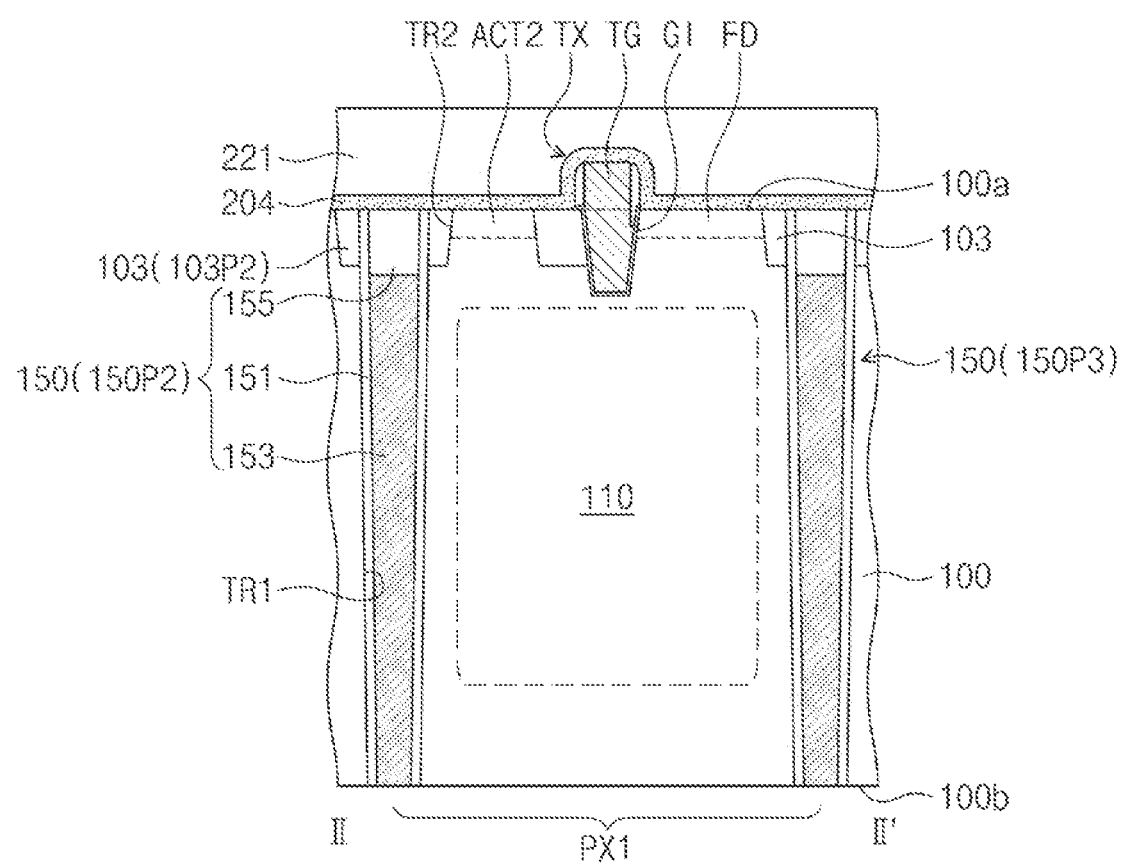

Referring to FIGS. 5, 22, and 23, a gate spacer GS may be formed on a sidewall of the protruding part PP of the transfer gate TG. The gate spacer GS may be formed by depositing a spacer dielectric layer and performing an anisotropic etching process. During the anisotropic etching process, the preliminary gate dielectric layer 171 may also be patterned to form a gate dielectric layer GI. For example, the gate spacer GS may include one or more of a silicon oxide layer, a silicon nitride layer, and a silicon oxynitride layer.

A resultant structure, in which the gate electrodes are formed, may undergo an impurity implantation process to form a first active pattern ACT1 and a second active pattern ACT2 each of which includes a floating diffusion region FD. Therefore, a transfer transistor TX and logic transistors may be eventually formed.

An etch stop layer 204 may be formed to cover the recessed region RR and the first surface 100a of the first substrate 100. The etch stop layer 204 may be formed of one or more of a silicon nitride layer, a silicon oxynitride layer, and a silicon carbonitride layer. In the recessed region RR, the etch stop layer 204 may contact a top surface of the first pixel separation part 150P1 and a top surface of the device separation pattern 103, but alternatively, the gate dielectric layer GI may remain between the etch stop layer 204 and the first pixel separation part 150P1 and between the etch stop layer 204 and the device separation pattern 103. Thereafter, a first dielectric layer 221 may be formed to cover the etch stop layer 204.

Referring back to FIGS. 5 and 6 to 8, lower vias 205 may be formed to penetrate the first dielectric layer 221 and to have connection with the transfer gates TG or the floating diffusion regions FD. After that, second dielectric layers 222 and 223 may be sequentially formed on the first dielectric layer 221. Wiring lines 212 and 213 and vias 215 may be formed in the second dielectric layers 222 and 223, and thus a first wiring layer 21 may be eventually formed.

An antireflective layer 132, a first lower dielectric layer 134, and second lower dielectric layers 136 may be sequentially formed on the second surface 100b of the first substrate 100. Color filters 303 may be formed on corresponding unit pixels PX. Micro-lenses 307 may be formed on corresponding color filters 303, and thus an optical transmittance layer 30 may be eventually formed.

With an increase in integration of an image sensor, a separated layout may be used to form the first recessed parts RP1 for forming the transfer gates TG adjacent to each other, and as a result there may be no separation between a plurality of neighboring transfer gates TG or there may occur an electric field concentration caused by the transfer gate TG has an excessively round shape at its sidewall in contact with the floating diffusion region FD. According to embodiments, a connected layout may be used to form the first recessed parts RP1 for forming the transfer gates TG adjacent to each other. Therefore, the second recessed part RP2 may provide a connected shape to the first recessed parts RP1 where a plurality of neighboring transfer gates TG are disposed. Accordingly, it may be possible to obtain a patterning margin for forming the transfer gates TG and to reduce an electric field concentration at a position where the transfer gate TG is connected to the floating diffusion region FD.

Figure 24:
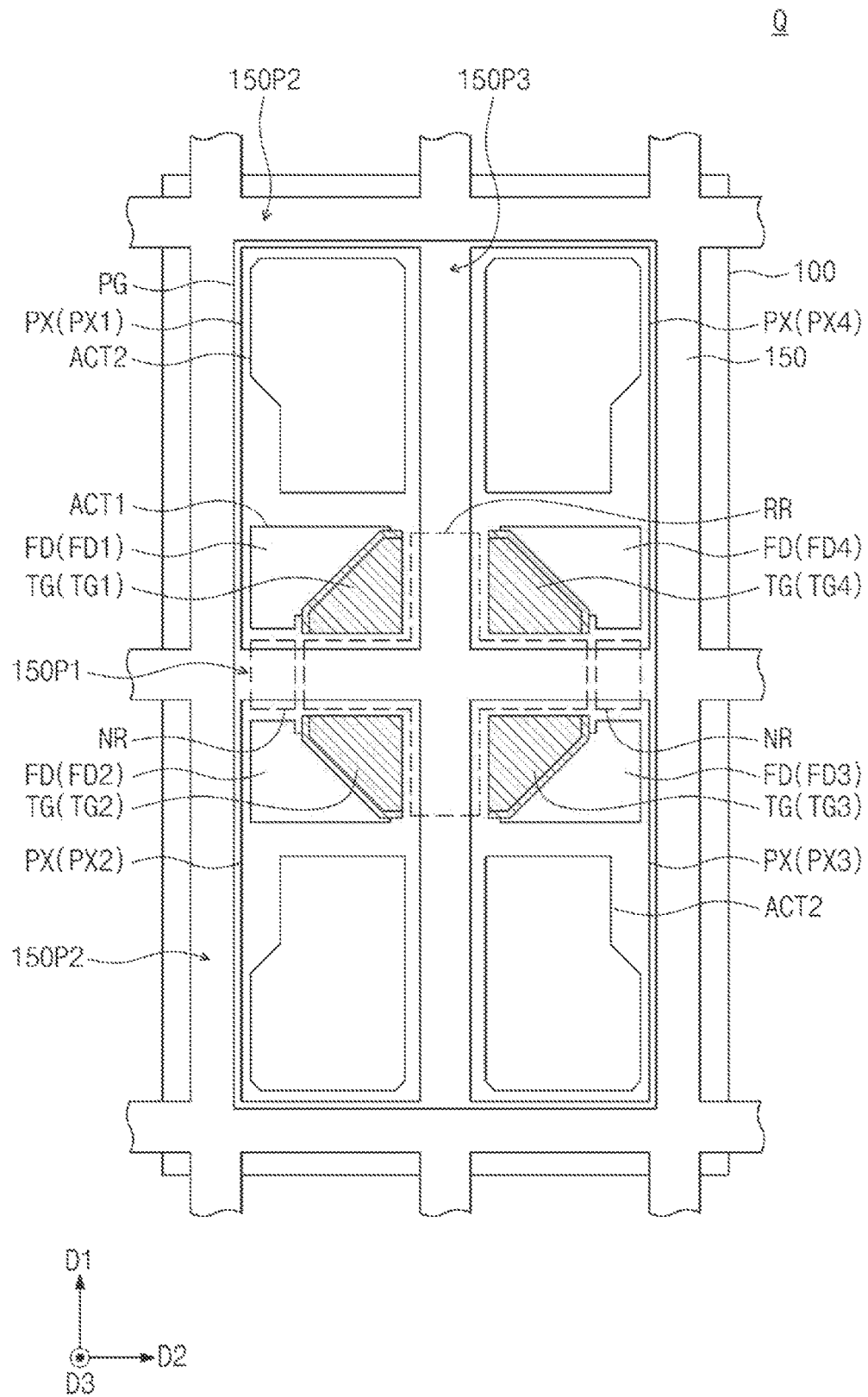
FIG. 24 illustrates an enlarged plan view showing section Q of FIG. 3.

FIG. 24 illustrates an enlarged plan view showing section Q of FIG. 3. For brevity of description, explanations of duplicate components will be omitted.

Referring to FIG. 24, an image sensor according to embodiments may be configured such that a first substrate 100 may include pixel groups PG each including a plurality of unit pixels PX. A single pixel group PG may include a first unit pixel region PX1, a second unit pixel region PX2, a third unit pixel region PX3, and a fourth unit pixel region PX4. A pixel separation pattern 150 may differentiate the first, second, third, and fourth unit pixel regions PX1, PX2, PX3, and PX4 from each other. The pixel separation pattern 150 may extend into a gap between the unit pixels PX of the first substrate 100. The pixel separation pattern 150 may have a grid or lattice structure. When viewed in plan, the pixel separation pattern 150 may completely surround each of the unit pixels PX. The first substrate 100 may be provided therein with a device separation pattern 103 which defines first active patterns ACT1 and second active patterns ACT2.

The pixel separation pattern 150 may include a first pixel separation part 150P1, a second pixel separation part 150P2, and a third pixel separation part 150P3. The first pixel separation part 150P1 may be disposed between the first unit pixel region PX1 and the second unit pixel region PX2 and between the third unit pixel region PX3 and the fourth unit pixel region PX4, while extending in a second direction D2. The third pixel separation part 150P3 may be disposed between the first unit pixel region PX1 and the fourth unit pixel region PX4 and between the second unit pixel region PX2 and the third unit pixel region PX3, while extending in a first direction D1. The second pixel separation part 150P2 may surround the pixel group PG.

The first unit pixel region PX1, the second unit pixel region PX2, the third unit pixel region PX3, and the fourth unit pixel region PX4 may respectively include a first transfer gate TG1, a second transfer gate TG2, a third transfer gate TG3, and a fourth transfer gate TG4. A distance between the first transfer gate TG1 and the third transfer gate TG3 may be substantially the same as a distance between the first transfer gate TG1 and the second transfer gate TG2. For example, the first to fourth transfer gates TG1 to TG4 may be formed in first recessed parts RP1 which are connected to each other through second recessed parts RP2 when a recessed part RS is formed as discussed with reference to FIGS. 16 and 17. In this case, the first to fourth transfer gates TG1 to TG4 may be formed based on a connected layout in which the first recessed parts RP1 for forming transfer gates are connected to each other.

The recessed region RR may be provided in the first pixel separation part 150P1 and the third pixel separation part 150P3. The second pixel separation part 150P2 may be the non-recessed region NR. For example, as shown in FIG. 24, the recessed region RR may have a cross shape at a location between the first to fourth transfer gates TG1 to TG4. The first pixel separation part 150P1 may have the non-recessed region NR at a location between a first floating diffusion region FD1 of the first unit pixel region PX1 and a second floating diffusion region FD2 of the second unit pixel region PX2. Likewise, the first pixel separation part 150P1 may have the non-recessed region NR at a location between a third floating diffusion region FD3 of the third unit pixel region PX3 and a fourth floating diffusion region FD4 of the fourth unit pixel region PX4.

For an image sensor according to the embodiments, first recessed parts for forming neighboring transfer gates may be formed based on a connected layout to obtain a patterning margin for forming the transfer gates and to reduce an electric field concentration between the transfer gates and a floating diffusion region.

Although the embodiments have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. An image sensor comprising:
a substrate; and
a pixel separation pattern disposed in the substrate and interposed between a plurality of unit pixels,
wherein the plurality of unit pixels comprises a first unit pixel region and a second unit pixel region adjacent to the first unit pixel region in a first direction,
wherein the first unit pixel region and the second unit pixel region respectively comprise a first transfer gate and a second transfer gate,
wherein the pixel separation pattern comprises
a first pixel separation part interposed between the first unit pixel region and the second unit pixel region; and
a second pixel separation part spaced apart from the first pixel separation part in the first direction,
wherein the second transfer gate is interposed between the first pixel separation part and the second pixel separation part, and
wherein a top surface of the first pixel separation part is lower than a top surface of the second pixel separation part.

2. The image sensor of claim 1, wherein the plurality of unit pixels further comprises a third unit pixel region adjacent to the first unit pixel region in a second direction orthogonal to the first direction,
wherein the pixel separation pattern further comprises a third pixel separation part interposed between the first unit pixel region and the third unit pixel region, and
wherein the top surface of the first pixel separation part is lower than a top surface of the third pixel separation part.

3. The image sensor of claim 2, wherein the plurality of unit pixels further comprises a fourth unit pixel region spaced apart from the first unit pixel region in the first direction,
wherein the second unit pixel region is interposed between the first unit pixel region and the fourth unit pixel region,
wherein the fourth unit pixel region comprises a fourth transfer gate spaced apart from the second transfer gate in the first direction,
wherein the second pixel separation part is interposed between the second transfer gate and the fourth transfer gate, and
wherein a distance between the first transfer gate and the second transfer gate is less than a distance between the second transfer gate and the fourth transfer gate.

4. The image sensor of claim 1, wherein the first transfer gate comprises:
a buried part disposed in the substrate; and
a protruding part protruding from a top surface of the substrate, and wherein a distance between the top surface of the substrate and a top surface of the first pixel separation part is in a range of about 15% to about 35% of a thickness of the buried part.

5. The image sensor of claim 4, wherein a distance between a top surface of the second pixel separation part and the top surface of the first pixel separation part is in a range of about 600 Å to about 1,200 Å, wherein the thickness of the buried part is in a range of about 3,500 Å to about 5,000 Å, and wherein a thickness of the protruding part is in a range of about 1,000 Å to about 1,400 Å.

6. The image sensor of claim 1, wherein the first unit pixel region and the second unit pixel region respectively comprise a first floating diffusion region and a second floating diffusion region that are adjacent to a top surface of the substrate, wherein the first pixel separation part comprises:

a first top surface interposed between the first transfer gate and the second transfer gate; and a second top surface interposed between the first floating diffusion region and the second floating diffusion region, and wherein the first top surface is lower the second top surface.

7. The image sensor of claim 1, wherein the first unit pixel region comprises a first floating diffusion region adjacent to a top surface of the substrate, wherein the first floating diffusion region is adjacent to the first transfer gate in a second direction orthogonal to the first direction, and wherein a sidewall of the first transfer gate intersects a sidewall of the first floating diffusion region at an angle greater than or equal to about 90 degrees, and wherein the sidewall of the first transfer gate is adjacent to the first floating diffusion region.

8. The image sensor of claim 1, further comprising a device separation layer disposed in the substrate and interposed between a plurality of active regions of the substrate, wherein a top surface of the device separation layer interposed between the first transfer gate and the second transfer gate is lower than a top surface of the substrate.

9. The image sensor of claim 8, wherein the first unit pixel region and the second unit pixel region respectively comprise a first floating diffusion region and a second floating diffusion region that are adjacent to the top surface of the substrate, and wherein the top surface of the device separation layer interposed between the first transfer gate and the second transfer gate is lower than a top surface of the device separation layer interposed between the first floating diffusion region and the second floating diffusion region.

10. The image sensor of claim 9, wherein the top surface of the device separation layer interposed between the first transfer gate and the second transfer gate is at a substantially same level as the top surface of the first pixel separation part.

* * * * *